(12) United States Patent
Hernandez et al.

(10) Patent No.: US 7,777,656 B2
(45) Date of Patent: Aug. 17, 2010

(54) DECODING, ENCODING/DECODING AND CONVERTING

(75) Inventors: Luis Hernandez, Madrid (ES); Dietmar Straeussnigg, Villach (AT); Andreas Wiesbauer, Poertschach (AT)

(73) Assignee: Lantiq Deutschland GmbH, Neubiberg (DE)

( * ) Notice: Subject to any disclaimer, the term of this patent is extended or adjusted under 35 U.S.C. 154(b) by 609 days.

(21) Appl. No.: 11/749,191

(22) Filed: May 16, 2007

(65) Prior Publication Data
US 2007/0268161 A1 Nov. 22, 2007

(30) Foreign Application Priority Data
May 19, 2006 (DE) .................. 10 2006 023 697

(51) Int. Cl.
*H03M 3/00* (2006.01)
(52) U.S. Cl. .................. 341/143; 341/61; 341/77; 341/118; 341/155
(58) Field of Classification Search .......... 341/110, 341/118, 120, 138, 143, 144, 155, 166; 375/340, 375/346
See application file for complete search history.

(56) References Cited

U.S. PATENT DOCUMENTS

| | | | | |
|---|---|---|---|---|
| 4,509,037 A * | 4/1985 | Harris | ........................ | 341/143 |
| 4,700,362 A * | 10/1987 | Todd et al. | ................... | 375/249 |
| 4,972,436 A * | 11/1990 | Halim et al. | ................. | 375/247 |
| 5,565,868 A * | 10/1996 | Azrouf et al. | ................ | 341/155 |
| 5,675,334 A * | 10/1997 | McCartney | .................. | 341/118 |
| 5,754,131 A * | 5/1998 | Ribner et al. | ................ | 341/143 |
| 5,880,687 A * | 3/1999 | May et al. | ..................... | 341/61 |
| 5,963,160 A * | 10/1999 | Wilson et al. | ................ | 341/143 |
| 6,087,968 A * | 7/2000 | Roza | ........................... | 341/143 |
| 6,121,910 A * | 9/2000 | Khoury et al. | .............. | 341/143 |
| 6,476,754 B2 | 11/2002 | Löwenberg et al. | | |
| 7,098,823 B2 * | 8/2006 | O'Dowd et al. | ............. | 341/118 |
| 7,342,525 B2 * | 3/2008 | Kang et al. | .................. | 341/143 |
| 7,403,144 B1 * | 7/2008 | Cruz-Albrecht et al. | ..... | 341/143 |
| 2007/0146185 A1 * | 6/2007 | Kang et al. | .................. | 341/143 |
| 2007/0165756 A1 * | 7/2007 | Lachartre | .................... | 375/346 |
| 2009/0109075 A1 * | 4/2009 | Straussnigg et al. | ......... | 341/143 |

FOREIGN PATENT DOCUMENTS

DE 10233391 C1 12/2003
WO 2004112298 A2 12/2004

OTHER PUBLICATIONS

"A 700/900mW/Channel CMOS Dual Analog Front End IC for VDSL with Integrated 11.5/14.5 dBm Line Drivers", M. Moyal, M. Gröpel, H. Werker, G. Mitteregger, J. Schambacher, Proc. of ISSCC 2003.

"A Continuous-Time Sigma Delta Modulator with 88dB Dynamic Range and 1.1MHz Signal Bandwidth", S. Yan, et al., ISSCC, pp. 62-63, Feb. 2003.

(Continued)

*Primary Examiner*—Linh V Nguyen
(74) *Attorney, Agent, or Firm*—SpryIP, LLC

(57) ABSTRACT

Implementations and embodiments of decoders, encoder/decoder systems and converters are depicted and described.

24 Claims, 15 Drawing Sheets

OTHER PUBLICATIONS

"A 70-mW 300-MHz CMOS continuous-time Sigma Delta ADC with 15-MHz bandwidth and 11 bits of resolution", Paton, S.; Di Giandomenico, A.; Hernandez, L.; Wiesbauer, A.; Potscher, T.; Clara, M., Solid-State Circuits, IEEE Journal of, vol. 39, Issue 7, Jul. 2004 pp. 1056-1063.

"Analog-to-digital conversion via duty-cycle modulation", Roza, E.; Transactions on Circuits and Systems II: Analog and Digital Signal Processing, IEEE, vol. 44, Issue 11, Nov. 1997 pp. 907-914.

"An 8MHz, 72 dB SFDR Asynchronous Sigma-Delta Modulator with 1.5 mW Power Dissipation", E Roza, H Hegt, G van der Weide, A van Roermund—VLSI Circuits, 2004. Digest of Technical Papers. 2004.

"Time encoding and perfect recovery of bandlimited signals", Lazar, A.A.; Toth, L.T.; International Conference on Acoustics, Speech, and Signal Processing, 2003. Proceedings. (ICASSP '03). 2003 IEEE, vol. 6, Apr. 6-10, 2003, pp. VI—709-712 vol. 6.

"Sampling Theory in Fourier and Signal Analysis", chapter 10 "irregular sampling", pp. 102-112, J.R. Higgins, Oxford University Press Inc., US New York , 1996.

"Fast recovery algorithms for time encoded bandlimited signals", AA Lazar, EK Simonyi, LT Toth—Dep. Elect. Eng., Columbia Univ., New York, BNET Tech. Rep, 2004.

"Error-Rate Characteristics of Oversampled Analog-to-Digital Conversion", Z. Cvetkovic, M. Vetterli, IEEE Transactions on Information Theory, vol. 44, No. 5, Sep. 1998.

"The design of CMOS radio-frequency integrated circuits 2nd edition", chapter 15.4 "class d amplifiers", pp. 503-505, Thomas H. Lee, Cambridge University Press, US-New York, 2004.

"Nonlinear Systems", chapter 6.2 "the describing function method", pp. 351-359, Hassan K. Khalil, Macmillan Publishing Company, US New York, 1992.

"A digital signal processing approach to interpolation." R. W. Schafer and L. R. Rabiner. Proc. IEEE, 61(6):692-702, Jun. 1973.

"Interpolation revisited." P. Thevenaz, T. Blu, M. Unser ,IEEE Transactions on Medical Imaging, 2000, p. 1. vol. 19, No. 7, Jul. 2000.

"Poly-Phase Sigma-Delta Modulation" E. Roza, IEEE Transactions on circuits and Systems II-Analog and Digital Signal Processing, vol. 44, Nov. 1997.

"Asynchronous Delta Sigma Modulation", C.J. Kikkert and D.J. Miller Proceedings of the IREE, Apr. 1975, pages No. 83-88.

"Perfect Recovery and Sensitivity Analysis of Time Encoded Bandlimited Signals" IEEE Transactions on circuits and systems-I:regular papers, vol. 51, No. 10, Oct. 2004.

\* cited by examiner

DECODING, ENCODING/DECODING AND CONVERTING

DETAILED DESCRIPTION

The following detailed description explains exemplary embodiments of the present invention. The description is not to be taken in a limiting sense, but is made only for the purpose of illustrating the general principles of embodiments of the invention.

In the figures provided, same reference symbols may be assigned to elements which are similar or identical in terms of type, function and effect.

Figure 1A:
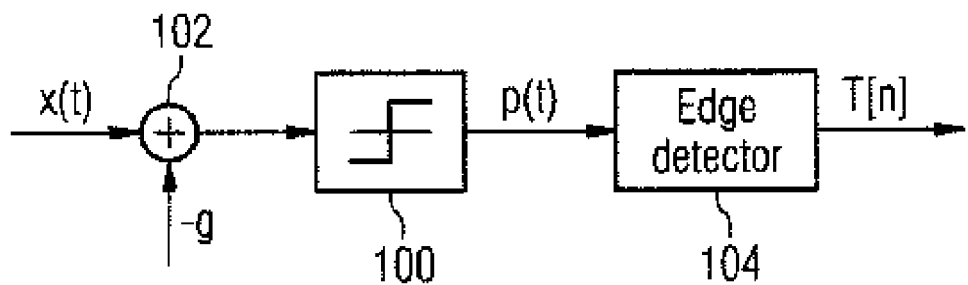
FIGS. 1a-d show a block diagram and graphs to explain an exemplary embodiment of the present invention.

In order to explain a first exemplary embodiment, FIG. 1a shows a block diagram of a system which produces a sequence T[n] which is obtained by threshold sampling of an input signal x(t).

FIG. 1a shows a quantizer or threshold detector 100 connected or coupled to a summation node 102. Connection or coupling may be either by direct connection or coupling or by indirect connection or coupling to further components or circuits arranged in between, for example a filter, signal amplifier etc.

It should be noted that a quantizer or threshold detector used in the exemplary embodiments and in the claims should be interpreted widely. A threshold detector may be a component or a circuit in which an output signal with a predetermined signal value is generated as a function of one or more threshold values of an input signal to the threshold detector being overshot or undershot. The output signal value can be held until the threshold value is reached again, so that the output signal has a square-waveform, or the output signal value can be held for a predetermined time when the threshold value is overshot, after which the output signal can drop back again to a predetermined value. A threshold detector may be understood as a comparator of any type, for example a sign detector, an inverter or a Schmitt trigger.

Figure 1B:
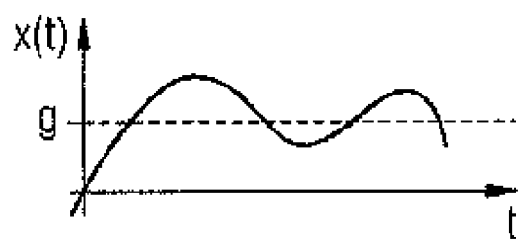
Figure 1C:
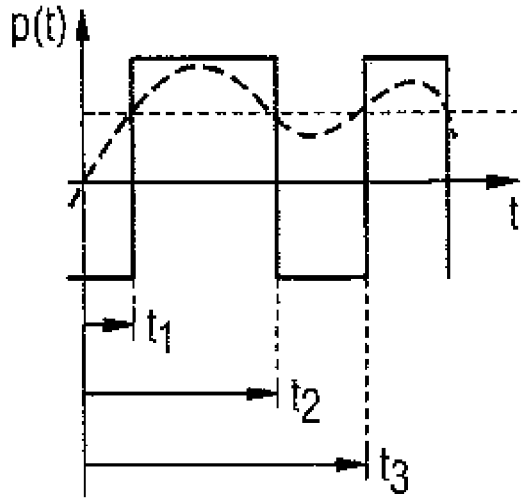
Figure 1D:
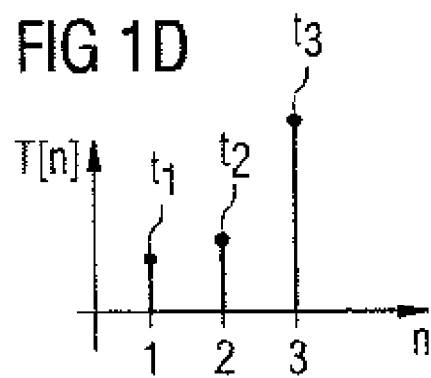

The summation node 102 receives the input signal x(t) and a signal −g, i.e. the inverse signal of g, which is constant over time. In other words, the difference signal x(t)−g is applied to the threshold detector 100 which produces an output signal p(t), as is illustrated in FIGS. 1b and 1c, depending on whether the difference signal is greater than the value zero. An edge detector 104 is connected to the output of the threshold detector 102 and receives its output signal p(t), as is illustrated in FIG. 1c. The edge detector produces a time sequence T[n], which is illustrated in FIG. 1d, with the information in the signal x(t) being contained in the time sequence T[n]. It should be noted that an edge detector as used in the exemplary embodiments and in the claims should be interpreted widely and covers for example any apparatus or circuit emitting an output signal which makes it possible to identify the location of signal edges.

X(t) is in this case intended to represent a signal limited from [−A,A] from the set B of band-limited signals, which has a finite energy and bandwidth Ω. The sampling operation can be regarded as a map of the signal x(t) onto a sequence x[n]. The sampling process may comprise uniform sampling, in which a sequence of values at uniform intervals is generated. In this case, according to the Nyquist-Shannon theorem, the minimum time interval must be $Ts=\pi/\Omega$ in order to allow the signal to be reconstructed without any loss of information."

However, the input signal can also be reconstructed without any loss of information by non-uniform or irregular sampling, provided that the Beurling density of the set of sample points is greater than the Nyquist sampling rate.

One possible way to carry out irregular sampling is to link the sample points to the signal waveform using a threshold g according to Eq. 1.

$$T[n]=\{t_n|x(t_n)=g,|g|<A,t_n<t_{n+1} \forall n \in N\}$$

$$\Gamma_n=(t_n,t_{n+1}), g \notin x(\Gamma_n) \quad \text{(Eq. 1)}$$

In this exemplary embodiment, the output signal p(t) of a threshold detector is generated as a function of the mathematical sign of the difference between the input signal x(t) and a signal g which is constant over time. The time sequence T[n] is generated by means of the time information provided by the edges of p(t).

However, the generating of the time sequence T[n] with only one threshold may not be stable for certain signals x(t). If, for example, a slow signal is assumed for x(t) whose bandwidth is less than Ω, then the signal will rarely exceed the threshold. Furthermore, a signal with an amplitude whose magnitude is below the threshold will not exceed the threshold. In both cases, the signal x(t) can be reconstructed only incompletely, or cannot be reconstructed.

For improving the above, according to one embodiment, a continuous auxiliary signal u(t) is added, such that:

$$\forall \Gamma_n=[t,t+T_s], g \in x(\Gamma_t)-u(\Gamma_t) \quad \text{(Eq. 2)}$$

In one exemplary embodiment, the function u may have a signal with a triangular waveform for example as used in pulse-width modulators (PWM modulators), with the period duration $T_c$ being shorter than $T_s$. However, in other exemplary embodiments, other signal waveforms, for example a signal with a square waveform or a sinusoidal signal, may be used. The signal may be a periodic signal, although it may also be a non-periodic signal. The addition of the auxiliary signal u(t) allows that the threshold g will be reached at least once within the time interval $T_s$, thus ensuring that the threshold detector is triggered at least once within the time interval $T_s$.

A decoding method for the time encoding described above can be achieved by producing the time sequence T[n] by means of the difference signal x(t)−u(t).

The decoding process is carried out as follows:

$$T[n]=\{t_n|x(t_n)-u(t_n)=g\} \quad \text{(Eq. 3)}$$

$$\Rightarrow x(T[n])=g+u(T[n])$$

That is, in the encoding, a time sequence T[n] is generated such that the samples $t_n$ of the sequence correspond to the time instances when the difference of the signal x(t) and the auxiliary signal u(t) is equal to the threshold g. The signal x(t) is reconstructed or decoded by adding to the threshold g the value of the signal u at the samples $t_n$ of the time encoded sequence Tn. The above encoding process results in the time sequence T[n] being stable, since the threshold is exceeded at least once in each time interval of duration $T_s$. Here, the signal u(t) may not need to be a band-limited signal. One sufficient condition for reconstruction of the signal x(t) without any loss of information, for the signal x(t), results from Eq. 2 to:

$$\forall \Gamma_t=[t,t+T_s],-(A+|g|),(A+|g|)] \subset u(\Gamma_t) \quad \text{(Eq. 4)}$$

Provided that u(t) satisfies the condition described in Eq. 4, it will exceed the threshold g. In the same way, a difference signal x(t)−u(t) will also exceed the threshold within the interval [t, t+$T_s$] provided that x(t) is a signal which is restricted to the interval [−A,A].

It should be noted that, instead of supplying the signal u($t_n$), a change over time in the threshold g with the function g(t) =g+u(t) also satisfies the same function as that described above.

Figure 2:
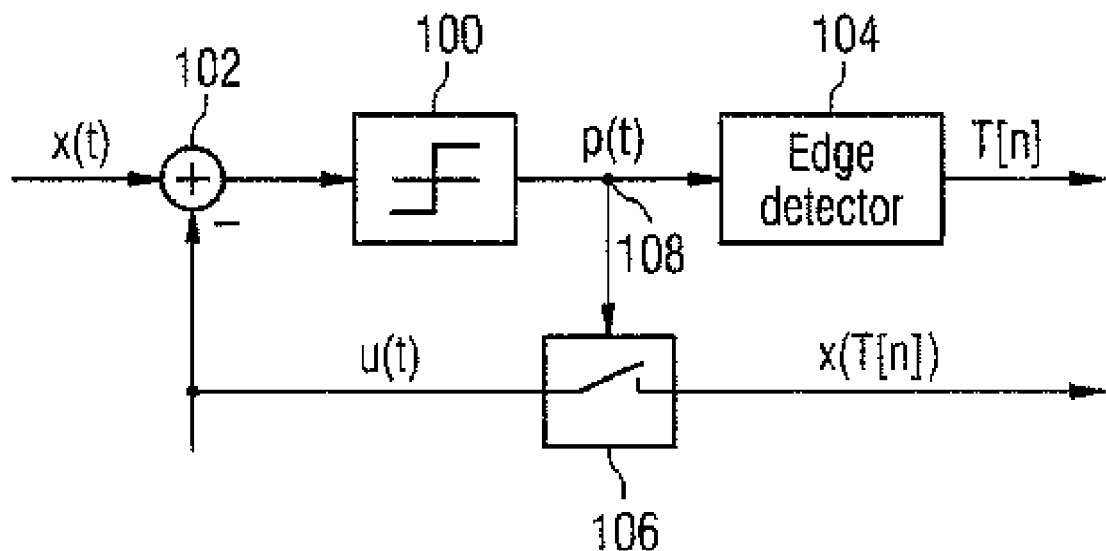
FIG. 2 shows a block diagram to explain an exemplary embodiment of the present invention, in which an auxiliary signal is used.

As a further exemplary embodiment, FIG. 2 now shows a modification of the exemplary embodiment shown in FIG. 1. As can be seen in FIG. 2, the signal −u(t), that is to say the inverse of the signal u(t), is applied to the summation node 102. Furthermore, a sample-and-hold element or sampler 106 is provided, which has a timing input which is arranged with a node 108 between the threshold detector 100 and the edge detector 104. The signal u(t) is thus sampled at the times of the edges of p(t), thus resulting in the generating of the sequence x(T[n]) which is irregular over time. In other words, the signal x(T[n]) is generated by sampling of the signal p[n] corresponding to edges of the time-encoded signal. The signal x(T[n]) is generated here on the basis of the edges of the time-encoded signal.

It is to be understood that FIG. 2 shows an encoding/decoding system which satisfies Eq. 3 explained above. If the decoder shown in FIG. 2 is compared with conventional signal recovery of pulse-width-modulated signals, in which an output signal is recovered by low-pass filtering, then the conventional recovery of the pulse-width-modulated signal by low-pass filtering allows only an approximation of the signal x(t), since the output signal p(t) from the threshold detector may have spectral components which are below the input bandwidth Ω of the signal x(t), and therefore cannot be filtered out. These undesirable spectral components become more severe the higher the frequency of the signal u(t) becomes. In other words, filtering of the output signal by means of a time-invariant low-pass filter does not represent ideal recovery of the signal x(t) and thus the limit-cycle frequency of the pulse-width modulator is not very high.

In the method described above for decoding the time-encoded signal by obtaining the time sequence x(T[n]), the signal x(t) can be recovered without any loss of information, irrespective of the limit-cycle frequency.

It is to be understood that in the case of an input signal x(t) which has a value zero that is constant over time, the sequence x(T[n]) may represent the zero crossings of the signal u(t) which correspond precisely to the values 0 of the input signal x(t). In the case of a pulse-width-modulated signal which is decoded by subsequent low-pass filtering, the situation in which the input signal is constant at the value 0 results, however, in an output signal which oscillates at the frequency of u(t).

It is to be understood that the signal u(t) may be a signal which is known a priori, such as a periodic signal at a fixed frequency and with a fixed amplitude, which is applied as an external signal to the encoder and, in a corresponding manner, to the decoder. In exemplary embodiments, as described below, the signal can also be generated by the encoder itself. In exemplary embodiments, the signal u(t) may be generated by an autonomous system.

Figure 2A:
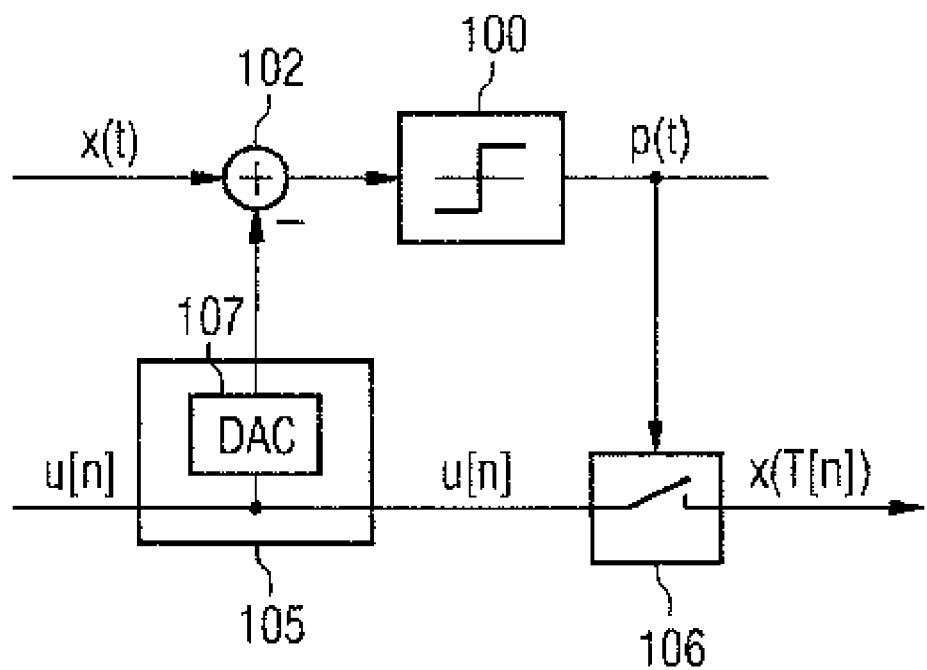
FIG. 2a shows a block diagram of an exemplary embodiment, in which an analogue auxiliary signal is generated from a digital signal.

In one exemplary embodiment, the signal u(t) can be generated from a digital signal u[n], as is shown in FIG. 2a. As can be seen from FIG. 2a, a signal generating unit 105 has a D/A converter (analogue-to-digital converter) 107. One input of the D/A converter 107 receives a digital signal. The D/A converter 107 converts the digital signal u[n] to an analogue signal u(t) which, as has already been explained above, is applied to an input of the summation node 102. The digital signal is also applied to the input of the sampler 106, which uses the digital signal u[n] to produce the signal x(T[n]) by a sampling using the edges of the signal p(t), as described above.

Furthermore, in one exemplary embodiment, the signal u(t) can be generated as a function of the encoded output signal from the encoder, as described in the following with reference to FIG. 3.

Figure 3:
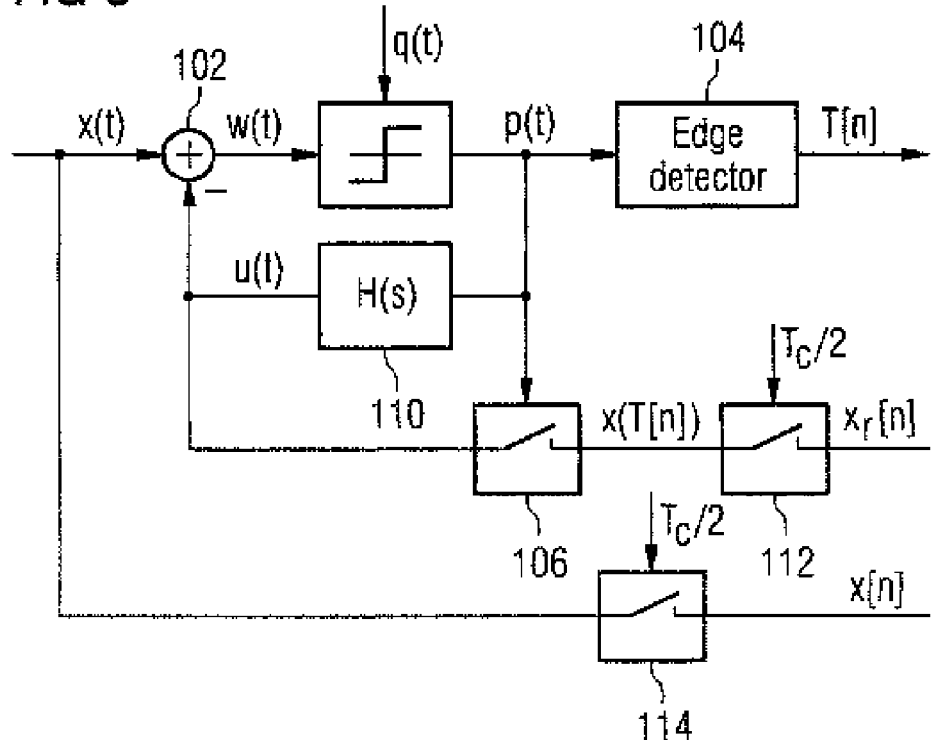
FIG. 3 shows a block diagram of an exemplary embodiment of the present invention.

FIG. 3 shows a block diagram of an encoding/decoding system according to one exemplary embodiment, in which the signal u(t) is generated by the encoder itself. The circuit design shown in FIG. 3 has, as a modification of the circuit design shown in FIG. 2, a feedback loop in which a loop filter 110 is arranged. The output of the loop filter 110 is connected to the summation node 102. This means that for the described system, the auxiliary signal u(t) which is used for coding purposes is generated by filtering of the output signal p(t) using the loop filter 110. Furthermore, the analogue difference signal w(t)=x(t)−u(t) is generated at the summation node 102, and is supplied to the threshold detector.

The encoder circuit design described in FIG. 3 represents an autonomous or self-oscillating system similar to self-oscillating pulse-width modulators, such as those used in Class D amplifiers. When a signal x(t) with the value 0 is applied, the encoder produces as the output signal a signal p(t) with a square waveform at a maximum oscillation frequency (limit-cycle frequency) with a period duration $T_c$, and an amplitude P. The oscillation frequency varies towards lower frequency values when the values of x(t) are not equal to zero, as a function of the value of the applied signal. In order to ensure the operation as an encoder, the loop filter is designed such that the signal u(t) has an amplitude which is greater than or equal to the amplitude A described in Eq. 3, and the period duration $T_c$ of the limit cycle is sufficiently short that the zero crossings of u(t) occur at a time interval which is shorter than $T_s$ for every band-limited input signal.

The output of the loop filter 110 is also connected to the sampler 106, which samples the signal u(t) with respect to the irregular time sequences T[n], and thus produces a representation x(T[n]) of the signal waveform of the signal x(t) from the time-encoded signal p(t).

Furthermore, in this exemplary embodiment, a synchronous sampler 112 is provided, which samples the signal x(T[n]) generated by the sampler 106 at a time interval which results in sampling at half the period duration of the limit cycle. The encoding/decoding system thus has a decoder which is formed by the two samplers 106 and 112.

The system shown in FIG. 3 may be represented in a linear analysis as a system in which the threshold detector or quantizer 106 introduces an error signal q(t). If a Laplace transformation is carried out on the variables, eq. 5 is obtained:

$$W(s) = \frac{X(s)}{1+H(s)} + \frac{Q(s) \cdot H(s)}{1+H(s)} \quad \text{(Eq. 5)}$$

The maximum input amplitude of the pulse-width modulator or pulse-width encoder can be determined from Eq. 5. If it is assumed that q(t) has a periodic signal waveform which is associated with the limit cycle with the period duration $T_c$, then u(t) can be assumed to be a sinusoidal signal with the period duration $t_c$, which is obtained by low-pass filtering of the square-waveform signal p(t) by means of the loop filter H(s). The amplitude of the sinusoidal signal is estimated by the following Eq. 6:

$$p(t) = P \cdot \text{sign}(u(t)) \quad \text{(Eq. 6)}$$

-continued
$$K \cong P \cdot |H(j\omega_c)|,$$
$$\omega_c = \frac{2\pi}{T_c}$$

If x(t) is assumed to be a signal at the frequency $\omega_0$, then Eq. 5 can be used to calculate the contributions of the signals q(t) and x(t) which these have for the signal w(t).

$$W(s) = W_x(s) + W_q(s) = \frac{X(s)}{1+H(s)} + \frac{Q(s) \cdot H(s)}{1+H(s)} \quad \text{(Eq. 7)}$$

$$w(t) = w_x(t) + w_q(t)$$

Eqs. 6 and 4 can be used to calculate an approximate limit for the amplitude A, i.e. the maximum amplitude of the input signal, as follows:

$$\max(|w_x(t)|) < \max(|w_q(t)|) \quad \text{(Eq. 8)}$$

$$\frac{A}{|1+H(s)|_{s=j\omega_0}} < \max(|w_q(t)|)$$

$$\frac{A}{|1+h(j\omega_0)|} < K$$

$$A < K|1+H(j\omega_c)| \cong P \cdot |1+H(j\omega_c)| \cdot |H(j\omega_c)|,$$

$$\omega_c = \frac{2\pi}{T_c}$$

As can be seen from Eq. 8, a wide input amplitude range can be achieved with a filter function H(s) with poles in the band defined by X(s). The loop filter can therefore not only be used to produce a correct limit cycle in the loop, but it also widens the dynamic range of the pulse-width modulator. The loop filter, for example the above integrator, may be arranged upstream of the threshold detector resulting in integration of the error between the feedback signal and the input signal, which allows decoding using known low-pass filters.

In the exemplary embodiment shown in FIG. 3, the sampler 112 samples the signal x(T[n]) output from the sampler 106 regular over time at half the period duration of the cut-off frequency of the limit-cycle pulse-width modulator. However, different sampling rates may be chosen for other exemplary embodiments.

The sampler 112 results in the signal x(T[n]), which is irregular over time, being converted to a signal $x_r[n]$ which is regular over time.

In other words, in this and further exemplary embodiments, the sampler 112 represents an asynchronous-to-synchronous converter. In other exemplary embodiments, other asynchronous-to-synchronous converters can be provided instead of the sampler 112, for example an interpolator. By way of example, an interpolator which carries out an interpolation process from a plurality of support points of the signal which is irregular over time, calculates the interpolated values at support points which are regular in time and emits them, can be used as an asynchronous-to-synchronous converter. The asynchronous-to-synchronous converter may be understood as a component or circuit element which converts a signal which is asynchronous over time to a synchronous signal. In other words, the asynchronous-to-synchronous converter is a converter which converts a signal that is sampled irregularly to a signal which is sampled regularly, for example, a signal with clock edges which are irregular over time is converted to a signal with clock edges which are regular over time.

The sampler 112 illustrated in FIG. 3 carries out a nearest-neighbour interpolation process for conversion of the signal which is irregular over time to a signal which is regular over time. The nearest-neighbour interpolation process represents a 0-order interpolation process. As will be explained in the following, different, higher-order interpolations can be used in other exemplary embodiments. If the signal $x_r[n]$ which is obtained by uniform sampling is compared with the signal $x[n]$ which is likewise obtained by uniform sampling of the input signal, as is illustrated in FIG. 3 by sampling of the signal $x(t)$ by means of a sampler 114, then the error $e_r[n]=x_r[n]-x[n]$ can be made indefinitely small provided that an ideal interpolation is used instead of the nearest-neighbour interpolation.

Figure 4:
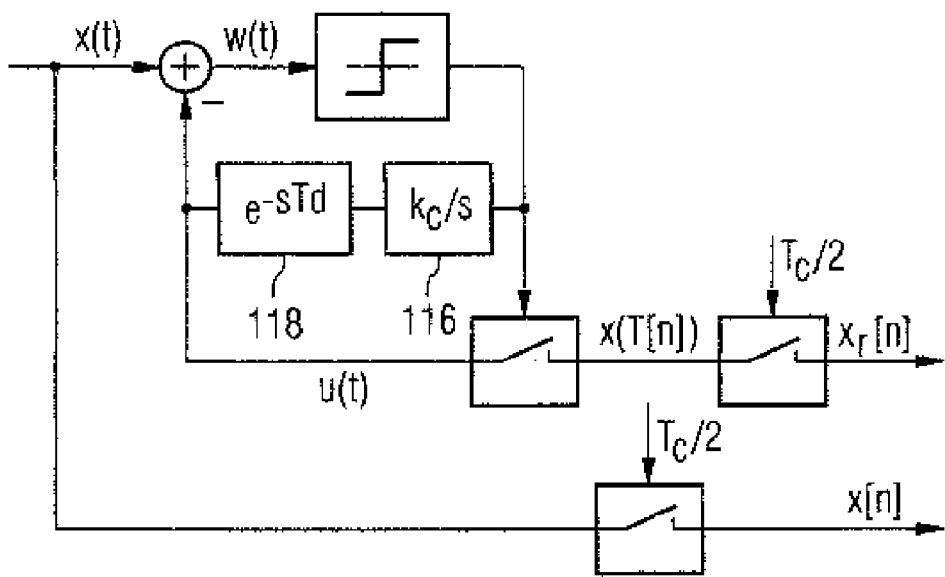
FIG. 4 shows a block diagram of a further exemplary embodiment of the present invention with an integrator.

FIG. 4 shows a further exemplary embodiment, in which the loop filter has an integrator 116 and a delay element 118.

Figure 5A:
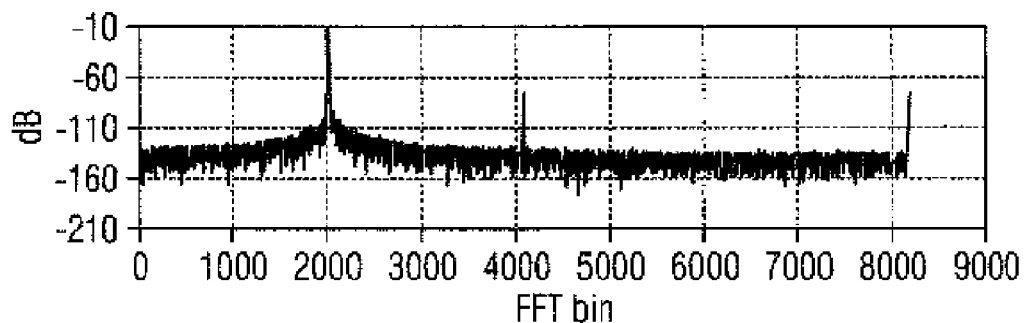
FIG. 5 shows a graph to illustrate a spectrum of an output signal of an exemplary embodiment of the present invention.
Figure 5B:
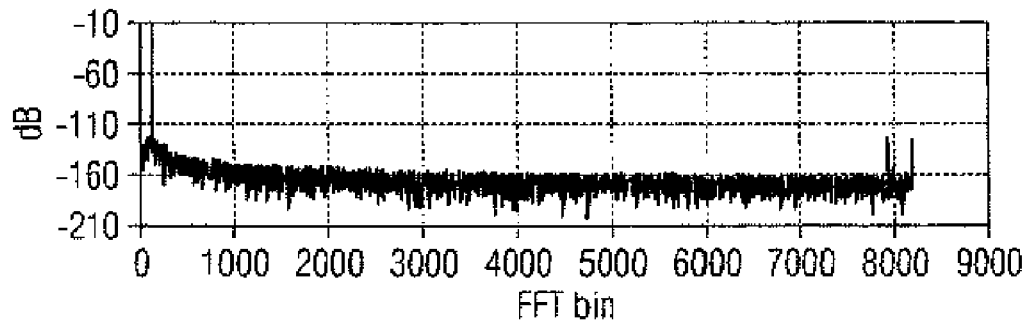

FIGS. 5a and 5b show results of a simulation in which the integrator 116 has a gain of $k_c=4/T_c$, and the delay element 118 has a constant delay of $T_d=T_c/4$.

FIGS. 5a and 5b show an illustration of a simulation, in order to indicate the relationship between the error $e_r[n]=x_r[n]-x[n]$ and the frequency of the input signal. The simulation was based on the assumption of P=1 and an input signal $x(t)$ with a constant amplitude, which is related to 0 dB. FIGS. 5a and 5b show the spectrum of $x_r[n]$, which is plotted on the y-axis in dB, versus the frequency $f_0$, which is plotted in arbitrary units on the x-axis.

In FIG. 5a, the frequency $f_0$ has a value of $f_c/4$, and in FIG. 5b the frequency $f_0$ has a value of $f_c/64$, in each case assuming the input signal amplitude to be −10 dB.

Non-white error noise is evident in a narrowband around the frequency of the input signal in both spectra. It is also evident that no traces of the limit cycle occur in the spectrum. As already described above, traces of the limit cycle would be evident in the output signal from the low-pass filter in the case of a known decoder which subjects only the time-encoded signal to low-pass filtering.

The spectra shown in FIGS. 5a and 5b also indicate that the signal-to-noise ratio SNR increases as the frequency of the input signal decreases.

Figure 6:
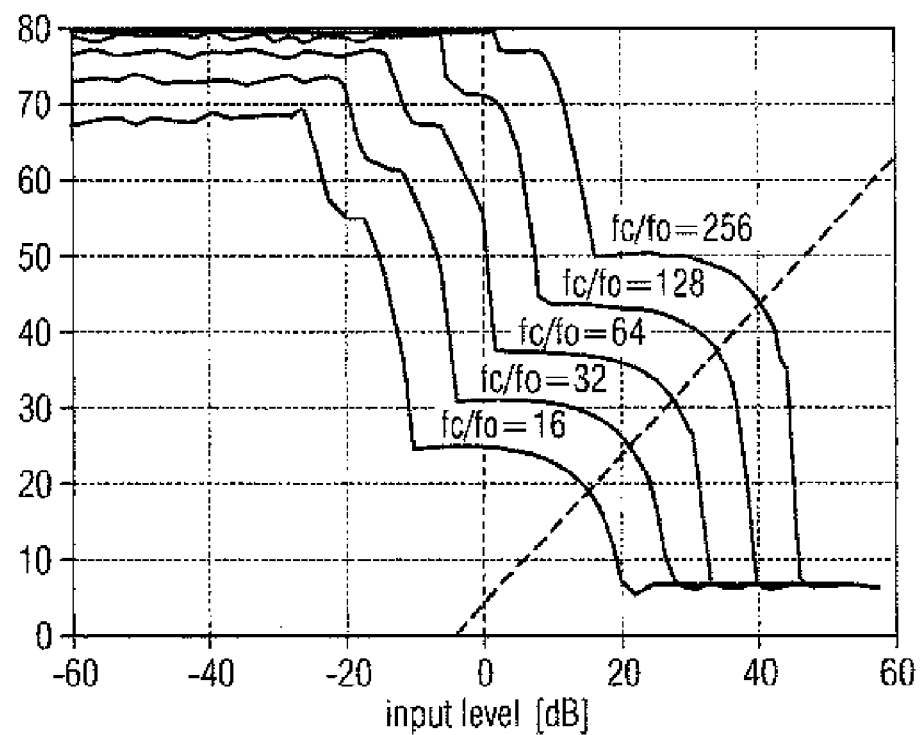
FIG. 6 shows a graph to illustrate the signal-to-noise and distortion ratio of an exemplary embodiment of the present invention.

FIG. 6 shows the relationship between the signal-to-noise and distortion ratio SNDR and the amplitude of the input signal for a plurality of frequencies f0, which are indicated with respect to the ratio $f_c/f0$.

A number of areas of the behavior of the encoding/decoding system can be seen in FIG. 6. Below a specific level, the SNDR rises and subsequently remains virtually constant for any input signal level.

Figure 7A:
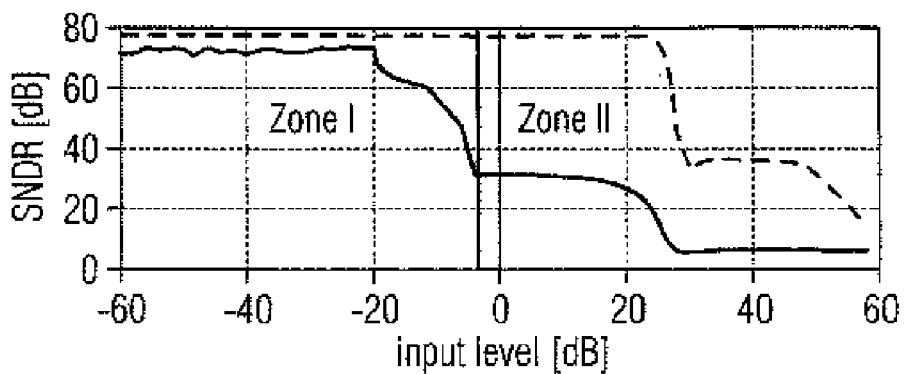
FIG. 7 shows a graph to illustrate the signal-to-noise and distortion ratio and the variance of an exemplary embodiment of the present invention.

FIG. 7a shows, as a solid line, the profile illustrated in FIG. 6 for the frequency $f_c/f0=32$. The dashed line in FIG. 7a shows the profile of the SNDR that results from interpolation of the signal waveform x(T[n]), which is sampled irregularly over time, by means of a so-called cubic spline interpolator. As can be seen, the two areas of the behaviour are based on non-linear distortion effects, which are caused by the nearest-neighbour interpolation process that is used in the sampler 112, and not by the pulse-width encoder itself.

The change in the SNDR shown in FIG. 6 can be explained from analysis of the discrepancy between the time duration of the cut-off frequency of the limit-cycle decoder and the nominal rest value $T_c$, which represents the minimum cut-off value of the oscillation frequency.

Figure 7B:
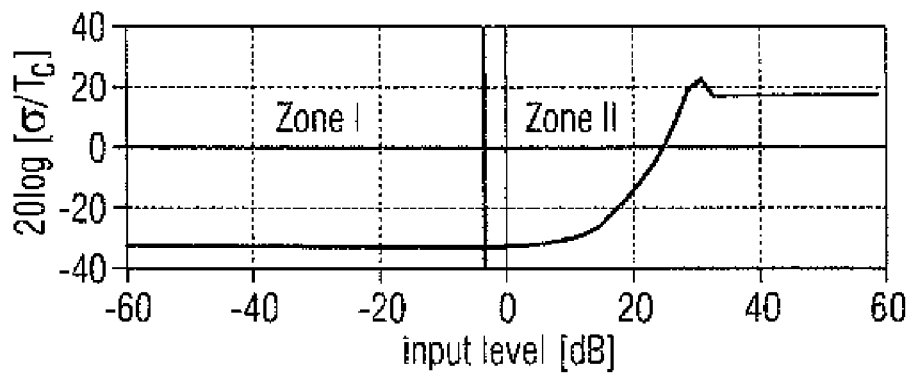

The graph in FIG. 7b uses a logarithmic scale to show the variance of the period time of the pulses which are generated by the pulse-width encoder, plotted against the minimum pulse period duration $T_c$. In the area I in which the SNDR remains constant, the pulse-width encoder produces only one pulse-width modulation in the signal p(t), which is at a frequency independent of the level of the input signal x(t). In the area II, the period duration of p(t) depends on the input level, which causes modulation of the instantaneous frequency of p(t) instead of a pulse-width change. This frequency modulation causes distortion of the signal, which is interpolated by the sampler at a fixed rate.

Figure 8:
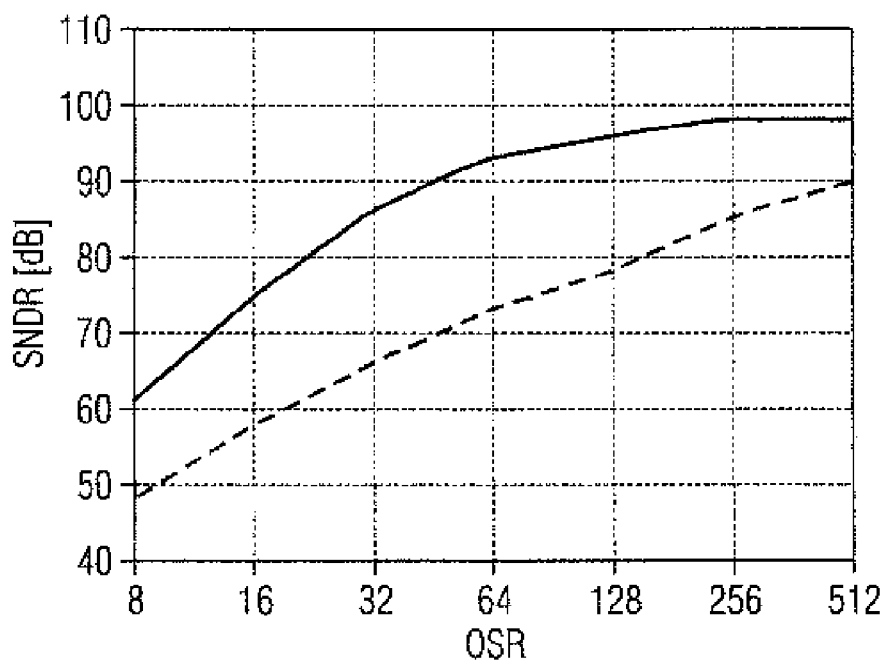
FIG. 8 shows a graph to illustrate the signal-to-noise of an exemplary embodiment of the present invention as a function of the oversampling ratio.

FIG. 8 shows the mean SNDR for input signals as a function of different oversampling ratios OSR. The dashed line in corresponds to an input signal level of −40 dB. The solid line corresponds to a circuit design according to one exemplary embodiment, in which noise shaping has been carried out, as will be explained in more detail in the following text.

As will be explained in the following, according to embodiments, noise shaping may be carried out on the error $e_r[n]$ in order to improve the SNR. In these exemplary embodiments, a circuit design may be provided wherein only analogue time-invariant filters are provided in the circuit avoiding complex interpolation algorithms although other implementations with digital filters may be provided in other embodiments. In the exemplary embodiments with noise shaping described in the following text, the input signal is sampled using a specific oversampling ratio OSR.

Figure 9:
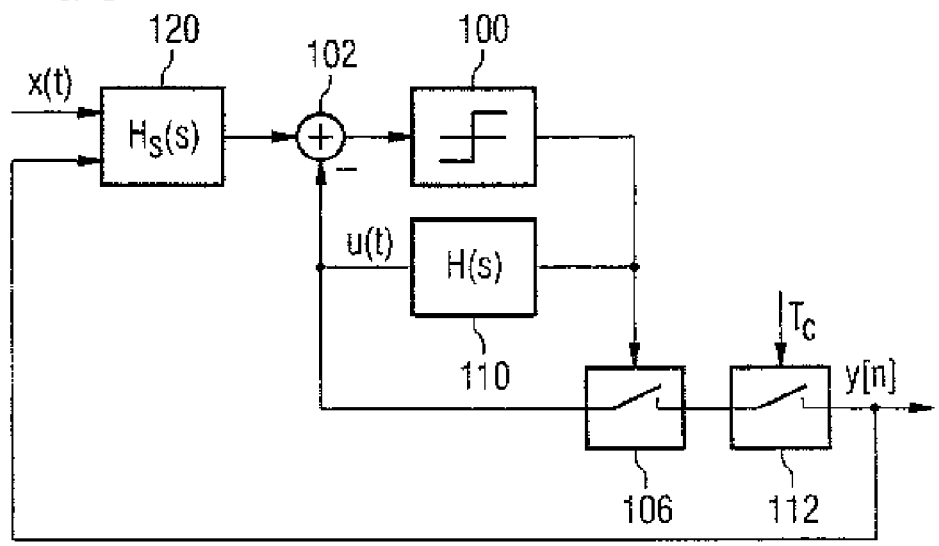
FIG. 9 shows a block diagram of an exemplary embodiment with noise shaping.

FIG. 9 shows the design shown in FIG. 3, with the output of the sampler 112 additionally being connected to an input of a filter 120 in the circuit design with noise shaping shown in FIG. 9. The input of the filter 120 is also connected to the input of the encoding/decoding system, in order to receive the input signal x(t) which is linked with the fed-back signal, in order to carry out spectral noise-shaping of the error $e_r[n]$ by means of the filter 120. The output of the filter 120 is connected to an input of the summation node 120, whose further input is connected to the backward path through the limit-cycle encoder. In other words, the filter 120 is functionally designed such that the feeding back of the output signal from the decoder results in noise shaping of the error which is introduced by the conversion of the signal which is irregular over time to a signal which is regular over time in the decoder.

Figure 10:
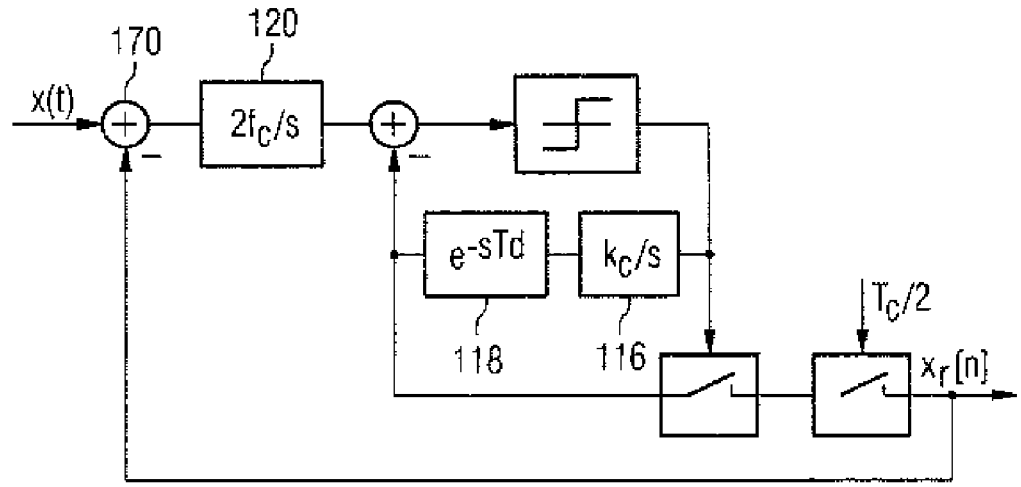
FIG. 10 shows a block diagram of a further exemplary embodiment with noise shaping.

FIG. 10 shows an exemplary embodiment in which noise shaping is carried out by a first-order noise-shaping function or characteristic in the circuit design shown in FIG. 4. The filter 120 shown in FIG. 10 may have for example a noise-shaping function $H_s(s)=2 f_c/s$ as shown in FIG. 10, although other noise shaping functions may be provided in other embodiments. The output signal $x_r[n]$ is looped back to an input of a summation node 170. A further input of the summation node 170 receives the analogue input signal x(t). One output of the summation node 170 is connected to the filter 120. Corresponding to FIG. 4, the loop filter in the limit-cycle loop is formed by an integrator 116 and a delay element 118.

Figure 11:
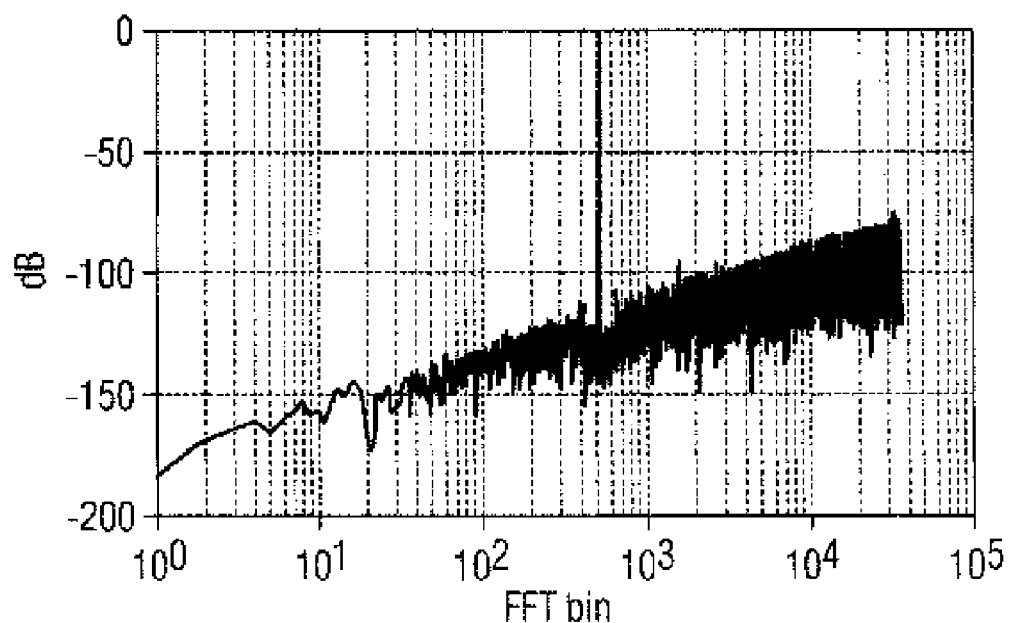
FIG. 11 shows a graph to illustrate an output signal spectrum according to an exemplary embodiment of the present invention.

FIG. 11 shows a simulation of the spectrum of $x_r[n]$ for an input signal of 0 dB and a frequency of $f_c/f_0=64$. The interpolation error $e_r[n]$ has a high-pass spectrum, with a gradient of 20 dB per decade.

The solid line in FIG. 8 shows the profile of the mean SNDR for different oversampling ratios OSR. In comparison with the dashed line in FIG. 8, in which no noise shaping was carried out, the SNDR is improved by using the noise-shaping loop.

Returning to FIG. 6, it can be seen from the illustration of the SNDR plotted against the input signal level that the provision of the integrator 116 in the limit-cycle loop or pulse-width-modulation loop results in the input amplitude range being widened, the lower the input frequency is. This can be combined with the noise-shaping effect, thus allowing an increase in the SNDR.

Figure 12:
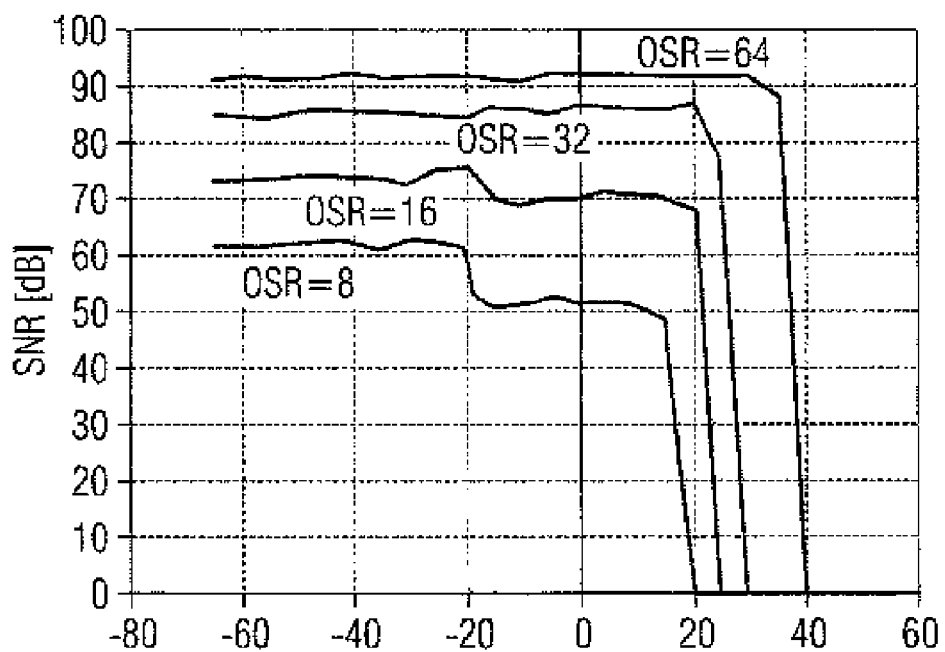
FIG. 12 shows a graph to illustrate the dynamic range of an exemplary embodiment of the present invention.

FIG. 12 shows the achievable dynamic range for the system in FIG. 10, for various OSRs.

An exemplary embodiment will now be explained with reference to FIG. 13, wherein the OSR can be reduced having at the same time a high SNR by using a multibit quantizer or multiple threshold detector which increases the sampling density per limit-cycle period duration.

Figure 13:
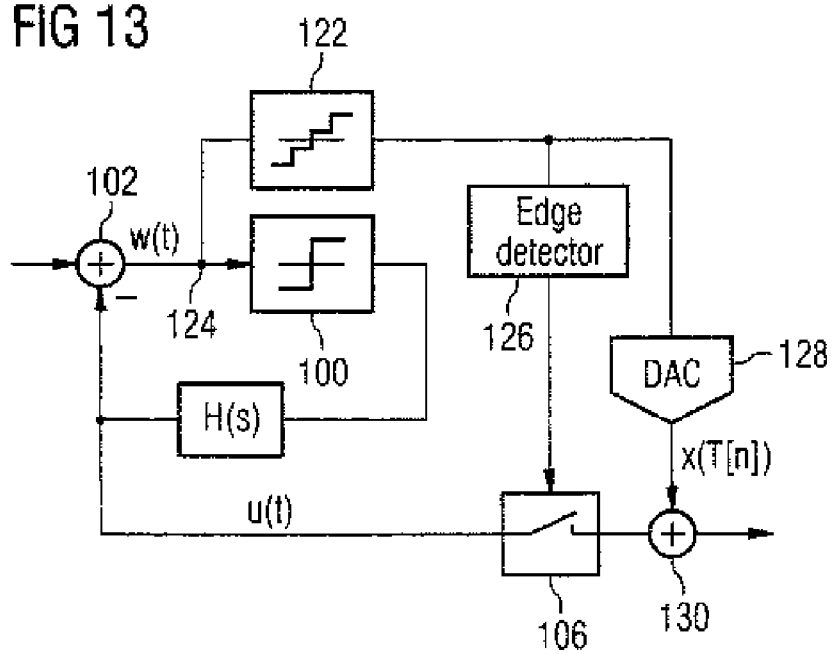
FIG. 13 shows a block diagram of a further exemplary embodiment with a multi-bit threshold detector.

As shown in FIG. 13, the input of a multibit quantizer or multiple threshold detector 122 is connected to a node 124 which is arranged between the summation node 102 and the threshold detector 100. By way of example, the multibit quantizer 122 may be a multibit flash quantizer. The output of the multibit quantizer 122 is connected to an input of an edge detector 126 and to an input of a D/A converter 128. One output of the edge detector 126 is connected to the sampler 106 for sampling of the signal u(t). In this exemplary embodiment, the output of the sampler 106 is connected to one input of a summation node 130. A further input of the summation node is connected to the output of the D/A converter 128.

Further exemplary embodiments, in which time quantization is carried out in the encoder, will be described in the following with reference to FIGS. 14 to 21. These encoding/decoding systems allow the use of digital circuit elements and the processing of the signals by means of digital circuitry and digital hardware. Furthermore, time quantization also allows the use of the described systems as a data converter, for example a digital-to-analogue converter.

According to one embodiment, by using a digital flip-flop instead of an analogue sample-and-hold unit, the signal p(t) can be sampled synchronously using digital technology.

Figure 14:
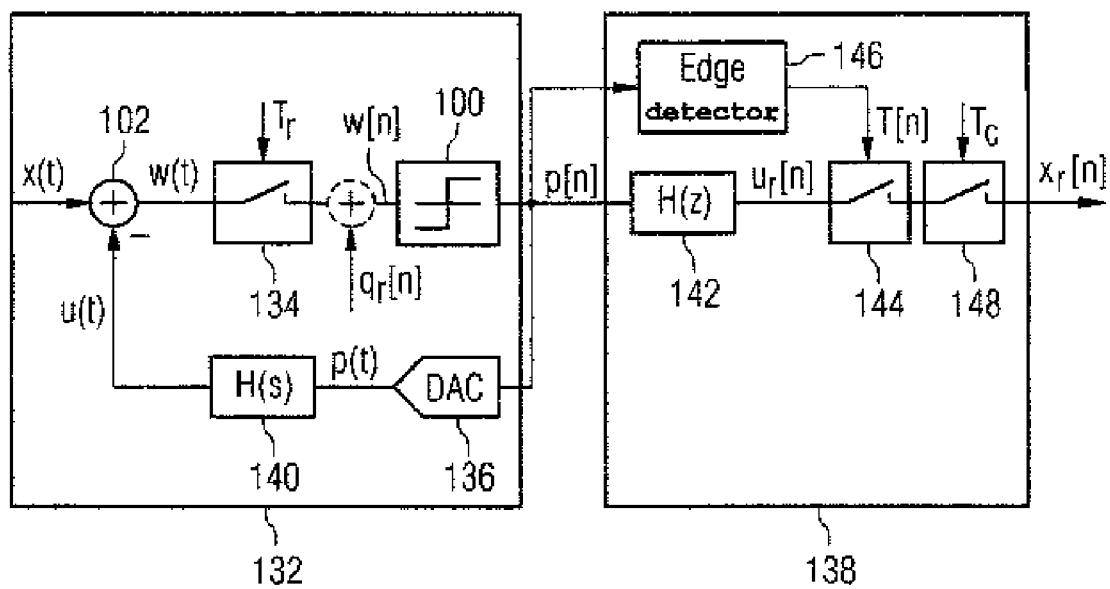
FIG. 14 shows a block diagram of an exemplary embodiment with time quantization implemented.

FIG. 14 shows an exemplary embodiment which introduces time quantization in the system shown in FIG. 3. Although only a number of selected exemplary embodiments for the implementation of time quantization will be described in the following text, it should be noted that any of the already explained exemplary embodiments may also be generated in the form of a time-quantized implementation, by using for example a sampler in the encoder as explained in the following text.

As shown in FIG. 14, a sampler 134 which carries out time quantization, at a sampling rate $1/T_r$, in the encoder 132 is arranged between the summation node 102 and the threshold detector 100 in the forward path of a encoder 132, which is in the form of a limit-cycle pulse-width modulator and has the threshold detector 100 as already described in FIG. 3. A D/A converter 136 is arranged in the backward path in the encoder 132, and is connected to an analogue filter 140. The output of the filter 140 is connected to the summation node 102.

The encoder/decoder system provides a sequence y[k] at the output of the decoder that represents a quantized version of x(t) where the quantization noise is spectrally shaped and that is oversampled by a ratio OSR, imposed by a sampling frequency fs=1/Tc being OSR times higher than the Nyquist sampling frequency. The system with time quantization in the encoder is provided with a clock of frequency fclk=1/Tr that is ROSR times higher than the sampling frequency fs of the output signal of the encoder/decoder system. The higher sampling rate at fclk=ROSR×fs relates to all the signal sequences indexed with n.

The encoding/decoding system illustrated in FIG. 14 has a decoder 138 with a digital filter 142 connected to the output of the encoder 132. One output of the filter 142 is connected to a sampler 144. A timing input of the sampler 144 is connected to one output of an edge detector 146, whose input is connected to the output of the encoder. The output of the sampler 144 is connected to one input of a sampler 148, which converts the asynchronous output signal, that is to say an output signal which has been sampled irregularly over time, from the sampler 144 to a synchronous signal, that is to say a signal which is regular over time. The sampler 144 samples at the sampling frequency fs=1/Ts thereby decimating the output signal $x_r[n]$ to the sampling frequency fs.

While FIG. 14 shows in the block diagram the encoder 132 and decoder 138 as separate blocks, it is to be understood that in the other embodiments described herein also encoders and decoders are provided although they are not shown as separate blocks.

It is be noted that, in this exemplary embodiment, two filters are provided, i.e. the analogue filter 140 which is arranged in the backward path in the encoder 132, and the digital filter 142 which is arranged in the decoder and, in one exemplary embodiment, digitally simulates or approximately simulates the filter function of the analogue filter 140. In this case, the expression approximately simulates should be understood as meaning that the filter function of one filter is a function of the filter function of the other filter, with a certain error being permissible, provided it does not exceed a specific magnitude. For example, the maximum error may be 1% or 5% or other values depending on the implementation provided.

In one exemplary embodiment, the D/A converter 136 may be arranged downstream from the filter 140, so that the signal u[n] obtained by filtering of the signal p[n] is converted from digital to analogue form, rather than the signal p[n], in the backward path in the encoder 132. In this case the filter 140 is a digital filter with filter function H(z). In one exemplary embodiment, this implementation may be used in order to dispense with the filter 142, since the signal p[n] is generated at the output of the filter 140, and can be supplied to the decoder in order to decode the time-encoded signal p[n].

While according the embodiments only one filter may be used, according to other embodiments, the use of two separate filters with the same or at least similar filter function, i.e. a filter in the encoder 132 and of a filter in the decoder 138, allows the simulation or approximate simulation of the filter 140 which is used for coding purposes in the feedback loop in the decoder, thereby the decoding process may be carried out only using the time-encoded signal p(t) or p[n], without any need for additional transmission of the respective signal u(t) or u[n].

With reference to FIG. 14, the introduction of time quantization in the encoder introduces an additional error into the system, since the sampled signal sequence T[n] does not match the sampled signal sequence T[n] which was generated by the non-time-quantized corresponding exemplary embodiment shown in FIG. 3.

This error $q_r[n]$ can be regarded as an additional component relating to the signal x[n]. In the system shown in FIG. 14, the signal $u_r[n]$ is generated using the signal p[n]. This is achieved by reproduction or simulating of the effect of the filter H(s) by the digital filter H(z), whose impulse response can be determined by application of the impulse-invariance principle to the filter H(s) at a sampling rate $T_r$. In this case:

$$H(z)=Z(h_d[n]), h_d[n]=h_a(nT_r)$$

$$h_a(t)=L^{-1}(H(s)) \qquad \text{(Eq. 9)}$$

The addition of the sampler 134 in the loop shown in FIG. 14 results in the signal $u(nT_r)$ being equal to the signal $u_r[n]$ output from the filter 142. In one exemplary embodiment, in which the signal p(t) is sampled outside the loop for generating of the time-encoded signal encoder, this would not always be satisfied, so that in this case an additional error is added to $q_r[n]$ because of the alias spectrum or the alias components of p(t). The additional error is discontinuous and thus represents a non-band-limited signal.

In the system shown in FIG. 14, both the filter H(s) and the filter H(z) have the alias spectrum. The following conditions will now be defined for the system shown in FIG. 14:

$$T_r < \frac{T_c}{ROSR}, \quad \text{(Eq. 10)}$$
$$ROSR > 2$$
$$\lim_{h \to \infty} H(S) = 0$$

The conditions quoted in Eq. 10 mean that H(s) asymptotically has a low-pass characteristic, and that H(s) and H(z) can be considered to be equivalent, provided that the ROSR (ratio oversampling rate) is sufficiently high.

Figure 15:
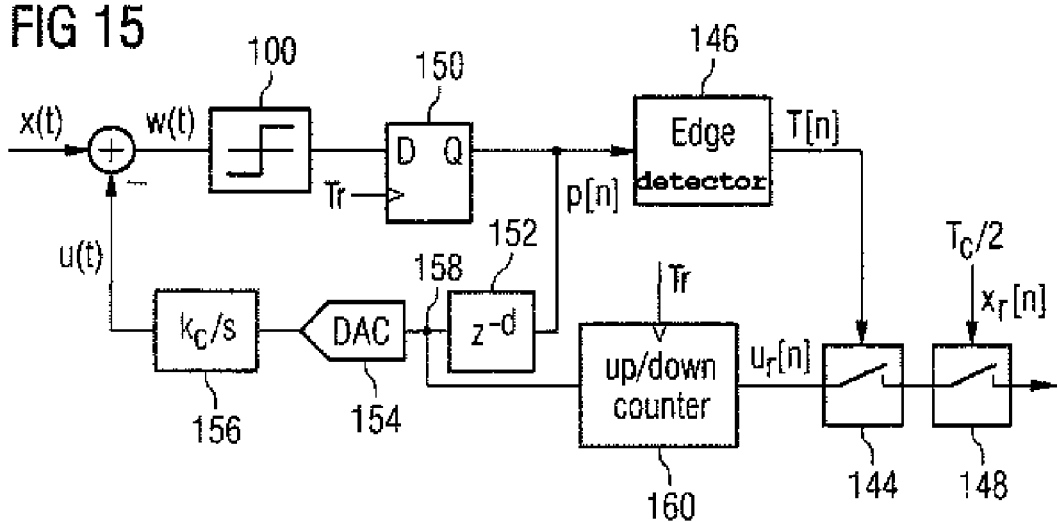
FIG. 15 shows a block diagram of a further exemplary embodiment with time quantization implemented.

FIG. 15 shows a further exemplary embodiment, which represents a modification of the exemplary embodiment shown in FIG. 14. A flipflop 150 corresponding to the sampler 134 in FIG. 14 having a clock signal input in order to receive a clock signal with the period duration Tr from a clock signal generator is provided. The data input of the flipflop 150 is connected to the output of the threshold detector 100. In the embodiment according to FIG. 15, the time quantizer provided by the flipflop in the limit-cycle loop of the encoder is arranged downstream from the threshold detector. It is to be understood that the embodiment according to FIG. 14 may also be modified to provide the sampler 134 downstream of the threshold detector 100.

Furthermore, a delay circuit 152, a D/A converter 154 and a filter 156 are provided in the backward path in the encoder in the exemplary embodiment shown in FIG. 15. This arrangement of the components corresponds to the exemplary embodiment shown in FIG. 4. Distinguished from the embodiment of FIG. 15, in the embodiment according to FIG. 4 the backward path feeds back only an analogue signal into the forward path, so that the delay element as shown in FIG. 4 is purely in analogue form.

Furthermore, in the embodiment according to FIG. 15, an output of an up-down counter 160 in the decoder is connected to a node 158 between the delay circuit 152 and the D/A converter 154. Corresponding to the exemplary embodiment shown in FIG. 14, the output of the up/down counter 160 is connected to the synchronous sampler 148, and has a timing input which is connected to the edge detector 146.

In the exemplary embodiment shown in FIG. 15, the digital filter H(z) 142 shown in FIG. 14 is formed by the up/down counter 160, and the delay element 118 shown in FIG. 4 is formed by the digital delay circuit 152 with an integral number of samples $z^{-d}$.

Figure 16A:
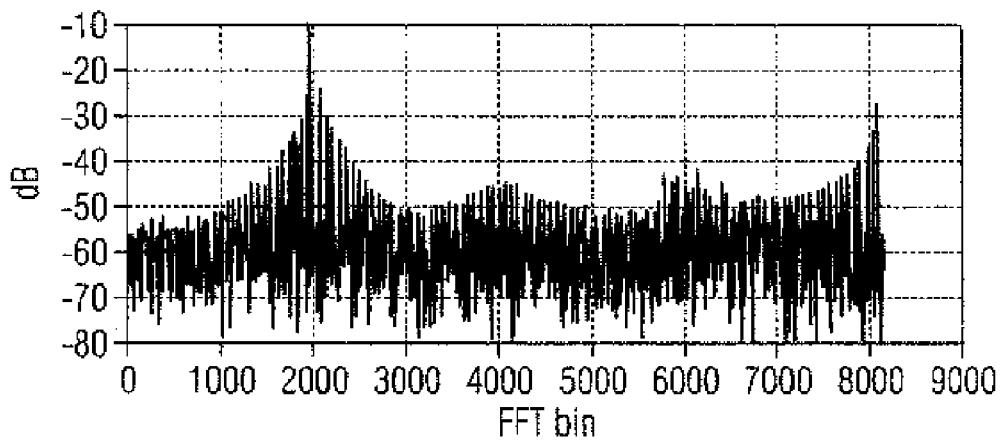
FIG. 16 shows a graph to illustrate the signal spectrum of an exemplary embodiment of the present invention.
Figure 16B:
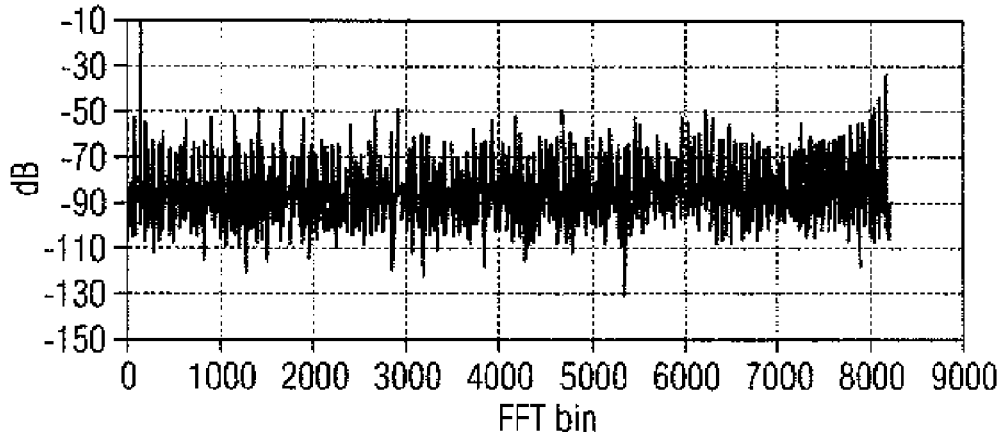

FIGS. 16a and 16b show a spectrum which is generated by the exemplary embodiment shown in FIG. 15 for the two sinusoidal test input signals, which have already been used in FIGS. 5a and 5b, with a ROSR (ratio oversampling rate) of 256. As can be seen, increased spectral components occur around the frequency of the input signal, and these increase as the frequency of the input signal rises.

Figure 17:
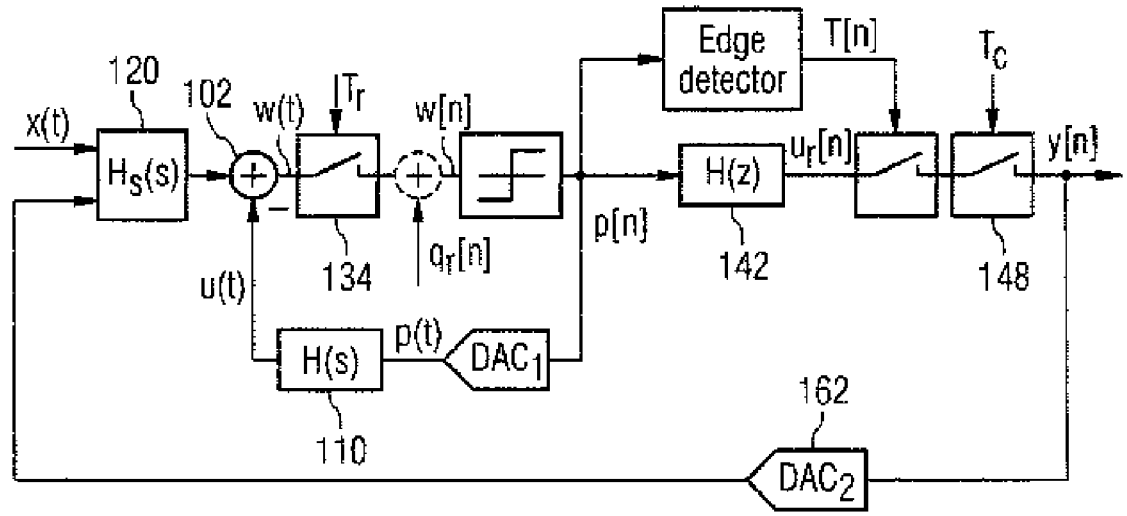
FIG. 17 shows a block diagram of an exemplary embodiment with noise shaping for pulse-width modulation with time quantization.
Figure 18:
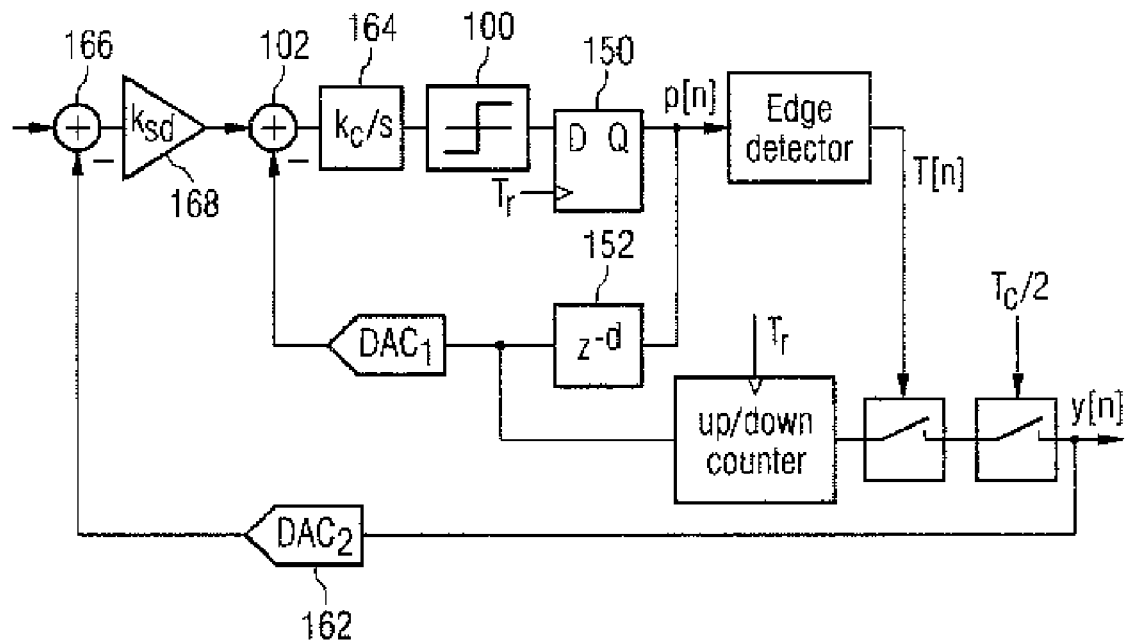
FIG. 18 shows a block diagram of a further exemplary embodiment with noise shaping for pulse-width modulation with time quantization.

In a further modification according to further exemplary embodiments illustrated in FIG. 17, a further spectral noise shaping is used to improve the spectral components of FIG. 16. It is to be noted that spectral noise shaping has been carried out in an analogous manner in the exemplary embodiment shown in FIG. 9. In the exemplary embodiment according to FIG. 17, noise shaping is used not only to compensate for an error which is introduced by the threshold detector 100, but also to compensate for an error which is introduced by the time quantization element for the synchronous time quantization in the limit-cycle loop, with the time quantization element in this exemplary embodiment being formed by the sampler 134, as shown in FIG. 17. In general, by way of example, a D-flipflop, as shown in FIG. 15 and FIG. 18 may be used instead of the sampler 134 as a synchronous time quantization element. Furthermore, the synchronous time quantization element in the exemplary embodiments can be arranged both upstream of the threshold detector 100 and downstream from the threshold detector 100.

In order to provide noise shaping, the output of the decoder is connected back to the input of the encoder. In the embodiment according to FIG. 17, the output of the sampler 148 is connected to an input of a further D/A converter 162. The output of the D/A converter 162 is connected then to the input of a filter 164. The output of the filter 164 is connected to an input of the summation node 102, and a further one of its inputs is connected to the backward path in the encoder.

With regard to the further circuit elements illustrated in FIG. 17, reference is made to the description of the preceding figures.

A further exemplary embodiment, which represents a modification of the exemplary embodiment shown in FIG. 17, is illustrated in FIG. 18. As shown in FIG. 18, the digital delay circuit 152 which has already been illustrated in FIG. 15 is arranged in the backward path, and is connected directly to the D/A converter 154. Furthermore, corresponding to FIG. 15, the filter 142 in the decoder shown in FIG. 17 is formed by the up/down counter 160, which is connected to the samplers 144.

In the exemplary embodiment described in FIG. 18, no filter is arranged in the backward path in the encoder. The filter 164 which is required for pulse-width modulation in the limit-cycle loop is arranged in the forward path in the encoder between the summation node 102 and the threshold detector 100.

In addition to the summation node 102, the encoding/decoding system shown in FIG. 18 has a further summation node 166, which has a first input which is connected to the D/A converter 162, and a second input in order to receive the input signal. The output of the summation node 166 is connected to one input of a filter 168, whose output is connected to one input of the summation node. In the system illustrated in FIG. 18, the filters Hs(s) 120 and H(s) 110 illustrated in FIG. 17 are formed by first-order integrators although other filter functions may be provided in other embodiments.

In the system illustrated in FIG. 18, the sigma-delta loop integrator and the integrator in the pulse-width-modulation loop are both formed by filter 164 which may be implemented for example as an integrator. The integrator gain may be subdivided into two gains according to Eq. 11:

$$k_c = \frac{4}{T_c}, \quad k_{sd} = \frac{1}{2} \quad \text{(Eq. 11)}$$

Figure 20:
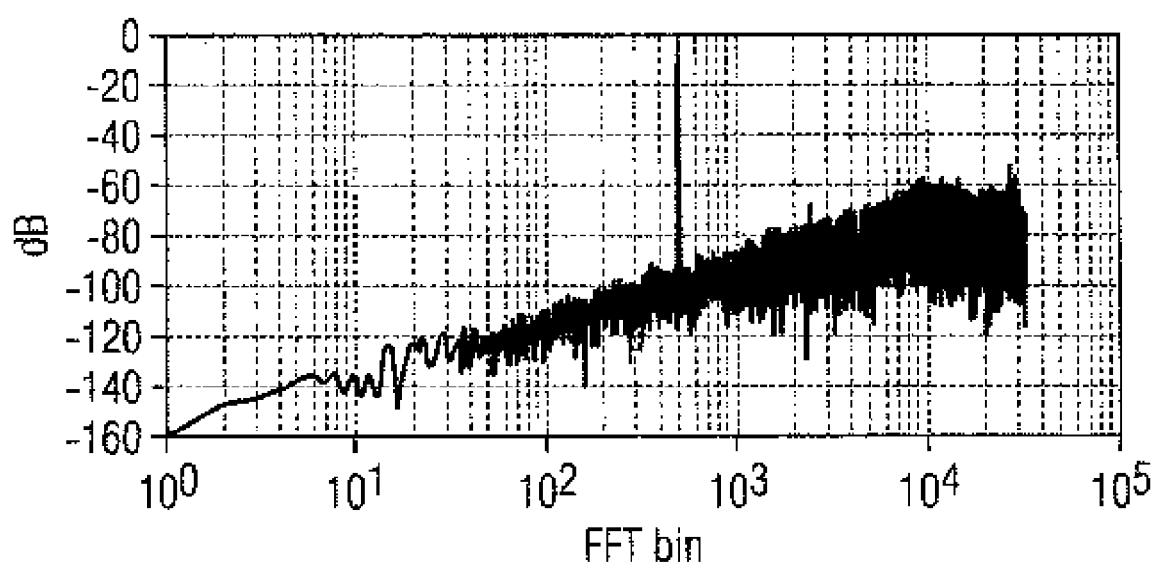
FIG. 20 shows a graph to illustrate the output signal spectrum of an exemplary embodiment with noise shaping and time quantization.

FIG. 20 shows a simulation of the spectrum generated by the system shown in FIG. 18, for a sinusoidal input signal for ROSR=8. The error $e_r[n]$ resulting from sampling of the signal, which is non-uniform over time in the decoder adds to the time quantization error owing to the synchronous time quantization $T_r$ in the pulse-width-modulation loop or limit-cycle loop, and has a high-pass spectrum which, corresponding to FIG. 11, has a gradient of 20 dB per decade.

Since the described exemplary embodiments each generate a digital output signal at the output of the decoder, they form A/D converters. In particular, the exemplary embodiments illustrated in FIGS. 8, 10, 17 and 18 with double noise shaping represent exemplary embodiments of a sigma-delta converter, in which the multibit quantizer that is used in conventional sigma-delta converters is replaced by a encoding/decoding system, as disclosed in the exemplary embodiments.

Figure 19:
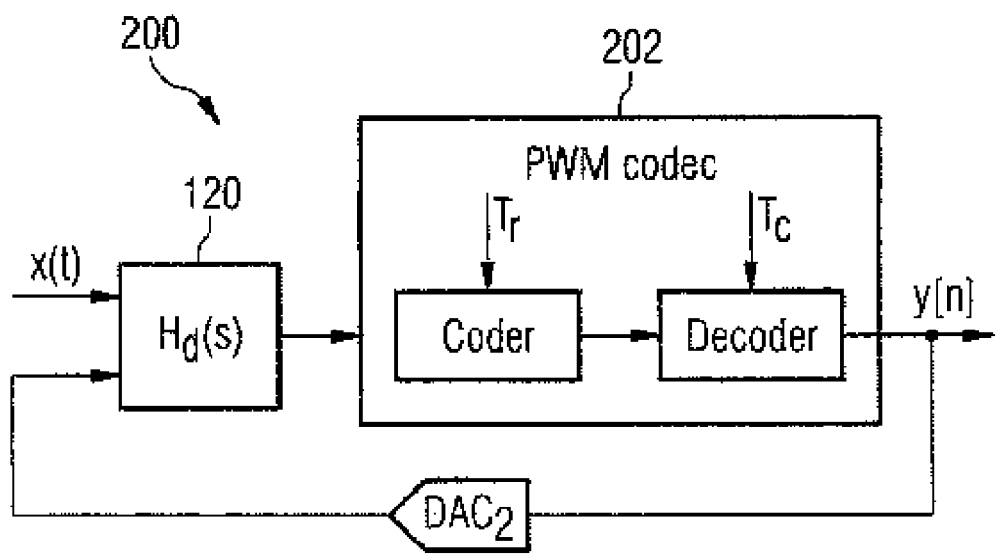
FIG. 19 shows a block diagram of a converter according to an exemplary embodiment.

This is illustrated in FIG. 19, in which the loop filter 120 is arranged in a forward path in a sigma-delta converter 200 and is connected to an encoding/decoding system 202, which may be designed according to the exemplary embodiments described above. The encoding/decoding system uses the analogue input signal to produce a digital output signal y[n], with an analogue signal, which is based on the output signal y[n] from the decoder, being fed back into the loop filter via a sigma-delta loop which includes the D/A converter 162.

Although the exemplary embodiments with a sigma-delta loop which carry out noise shaping in addition to the noise shaping in the pulse-width-modulation loop make use of a first-order implementation, other exemplary embodiments may also comprise more than one noise-shaping loop or sigma-delta loop, that is to say a second- or higher-order implementation. A corresponding situation applies to the noise shaping in the pulse-width-modulation loop. In other words, higher orders, that is to say a plurality of loops, can in each case be provided not only in the pulse-width-modulation loop but also in the "outer sigma-delta loop", that is to say the loop from the decoder back to the encoder.

Although the exemplary embodiments have used the encoding/decoding system according to the invention as a quantizer in a sigma-delta A/D converter, it is to be understood that other types of converters, for example converters based on delta modulators, can also use the encoding/decoding system described here, as a quantizer. In principle, the systems can also be used in the reverse way as D/A converters.

Although the encoder in the described exemplary embodiments is in the form of a pulse-width modulator, encoders for other time encodings can also be used in other exemplary embodiments.

The quantizer with a encoding/decoding system as provided in the embodiment according to FIG. 18 is now compared to a conventional sigma-delta modulator with a multibit quantizer.

FIG. 20a shows a comparison for a plurality of OSR and ROSR combinations for the sigma-delta modulator shown in FIG. 18, in comparison to a conventional sigma-delta modulator with a multibit flash quantizer, as is illustrated in FIG. 20b.

The value of P has been rescaled, so that the maximum input level is at 0 dB, and the frequency of the input signal is located in the centre of the signal bandwidth.

In the system shown in FIG. 18, the bandwidth which is required for the integrator, for the A/D converter and for the threshold detector is governed by the frequency $f_c$ of the limit cycle, and only a small section of the digital logic operates at the higher clock frequency $f_r=1/T_r$. The modulator shown in FIG. 18 would require operational amplifiers and A/D converters which use the same speed as the conventional modulator, as was used in FIG. 20b, since the sampling rate in FIG. 20b has been provided such that this is twice the value of the nominal cycle limit frequency. Furthermore, the x-axis has been adapted in FIG. 20a in order to match the ROSR to the number of comparators which are used in the flash quantizer. The dynamic power consumption in the analogue section of the two modulators shown in FIGS. 21a and 21b should thus be the same.

As can be seen, the SNR in the conventional modulator is scaled with the quantizer resolution.

For the system shown in FIG. 18, it can be seen from FIG. 20a that the SNR is determined by the value of ROSR and the restrictions which result from the nearest-neighbour interpolation, as has been explained with reference to FIG. 21. As can be seen, the SNR which can be achieved by the system shown in FIG. 18 is higher than that of the conventional modulator.

It is to be noted that an equivalent "resolution" of the quantizer implemented by the encoding/decoding system can be changed by scaling of the amplitude P of the coding output signal p(t). In the same way, the resolution can be changed by the word length of the up-down counter and the resolution of the A/D converter.

Figure 21A:
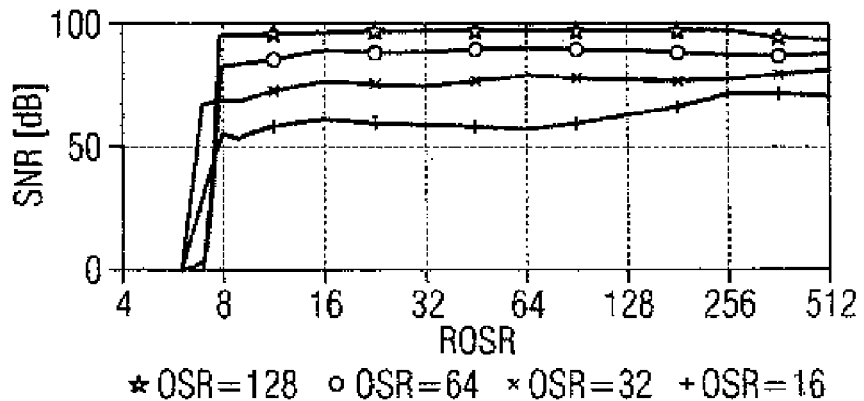
FIG. 21 shows a graph comparing the signal-to-noise ratio of an exemplary embodiment of the present invention with a known modulator.
Figure 21B:
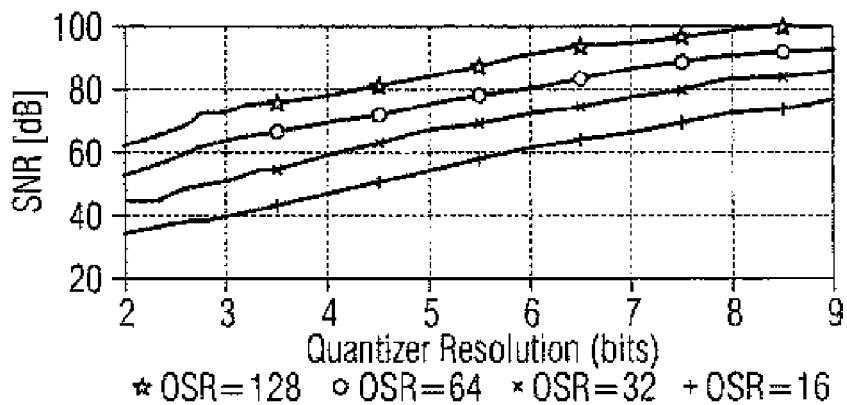
Figure 22:
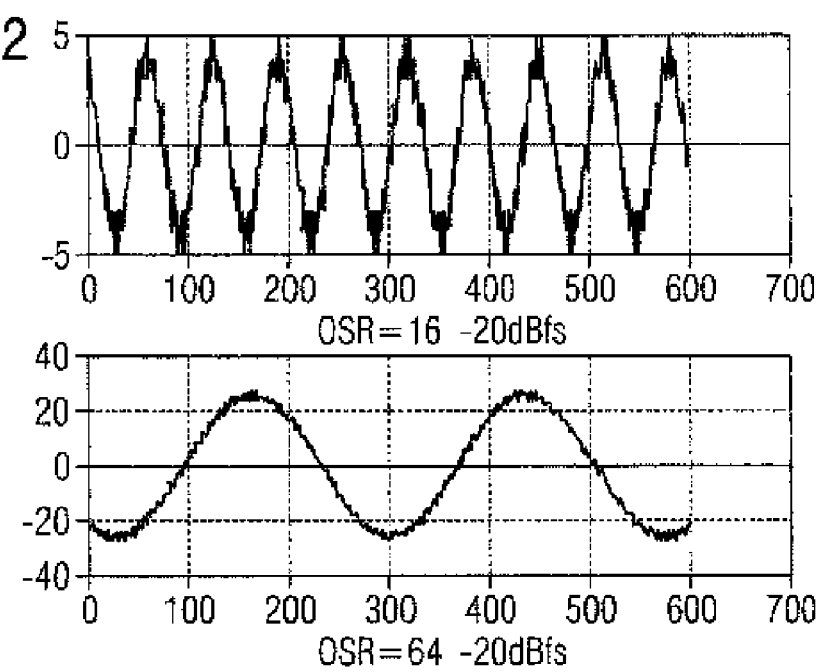
FIG. 22 shows a graph to illustrate the resolution of the quantizer according to exemplary embodiments of the present invention.

FIG. 22 shows a time-domain representation of the output signal from the modulator in FIG. 21a for OSR=16 and OSR=64, ROSR=8 in each case, with an input signal of −20 dB.

As can be seen, the system with OSR=64 uses more stages than the encoder with OSR=16 to represent the signal, with the area occupied by the quantizer in the hardware implementation being the same, apart from the fact that two more bits must be implemented in the counter. Furthermore, both the described systems have the same ROSR, so that the clock rate $f_r$ is the same.

While in the embodiments described above a converter makes use of an encoder having a self-oscillating pulse width modulator for encoding an analog signal in time, a noise shaping of the error introduced by sampling the time-encoded signal in the encoder and a decoder comprising of an asynchronous-to-synchronous converter implemented by an edge detector and, other embodiments may implement a decoder having a digital decimator for decoding the time-encoded signal and decimating the time-encoded signal.

Figure 23:
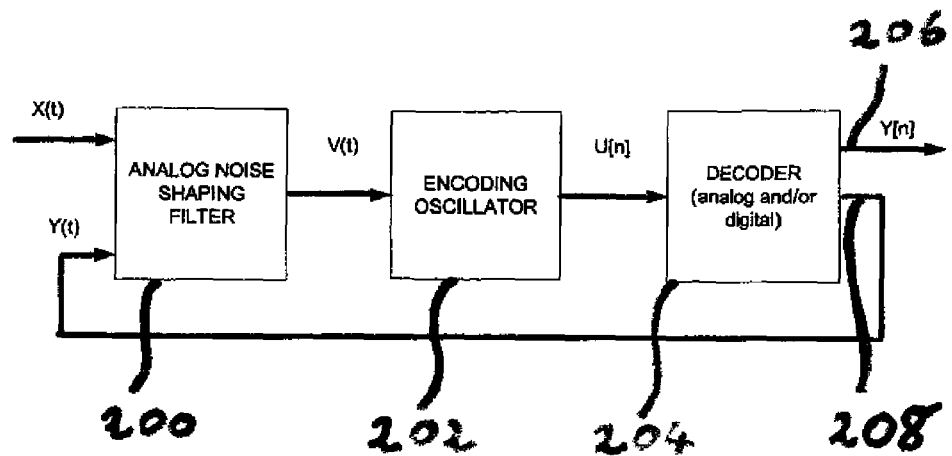
FIG. 23 shows a block diagram of a converter according to an embodiment of the present invention.

For all of these embodiments, the converter can be regarded as comprising of three blocks as depicted in FIG. 23.

A first block is formed by an analog noise shaping filter block 200 coupled to an encoding oscillator block 202. The encoding oscillator 202 receives a continuous time output signal V(t) of the noise shaping filter block having a quasi periodic waveform and modifies the signal V(t) to provide an oversampled single-bit signal U[n]. To this end, the encoding oscillator block 202 may comprise a sampler in the oscillator loop as described above.

A third block is formed by a decoder block 204 coupled to the encoding oscillator 202. The decoder block 204 receives the single-bit signal U[n] and provides at a first output 206 a numeric downsampled replica Y[n] representing the converted digital signal and at a second output 208 an analog feedback signal for the noise shaping filter block 200. The decoder block 204 may have either a digital, analog or mixed implementation.

It is further to be noted that in the block representation of FIG. 23, the noise shaping filter block 200 may either be provided in the feed forward path or in the feedback path. Furthermore, as will be described in more detail below, the noise shaping filter block 200 can be integrated with a loop filter of the encoding oscillator block 202.

Figure 24:
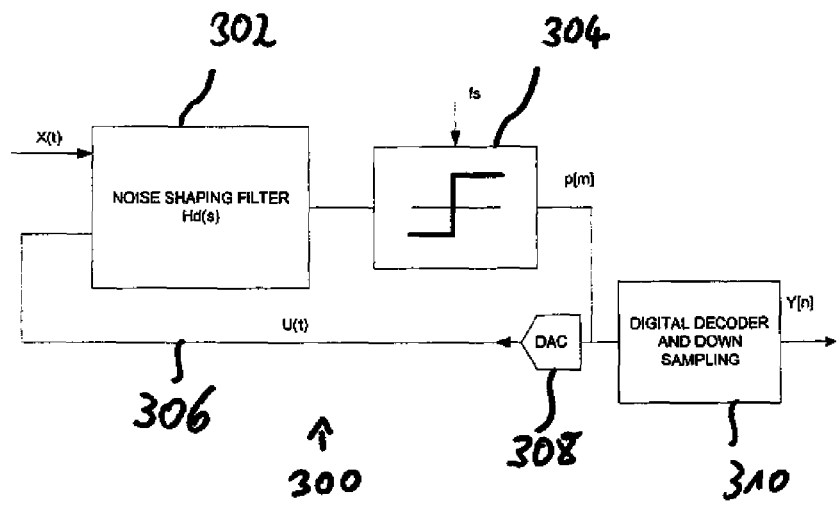
FIG. 24 shows a block diagram of a converter according to an embodiment of the present invention.

While in the embodiments described with respect to FIGS. 9 to 19, the feedback signal provided to the noise shaping filter block 200 is based on the output of the decoder 202, FIG. 24 shows now an embodiment where the feedback signal to the noise shaping filter block 200 is based on the output of the encoder block 202 rather than the output of the decoder block 204. Providing the feedback signal based on the output of the encoder block 202 allows to implement a single bit D/A converter for converting the single-bit signal into an analog feedback signal. The feeding back of the output of the encoder block 202 introduces a small additional error which is not noise shaped by noise shape filter 200. However, as outlined below, the small additional error is neglectable for typical operation frequencies.

FIG. 24 shows a converter 300 comprising a noise shaping filter 302, a quantizer 304, and a feedback path 306 coupling an output of the quantizer 304 to the noise shaping filter 302. The output signal of the quantizer 304 is a signal sampled with a oversampling frequency fs as indicated in FIG. 24. The sampling of the signal may for example be provided by a implementing a sampler downstream or upstream of the quantizer as described in the embodiments with respect to FIGS. 13, 14, 17 and 18. A D/A converter 308 is arranged in the feedback path 306 to convert the oversampled single-bit signal output by the quantizer 304 into an analog signal. The D/A converter may be implemented as single-bit D/A converter. Furthermore, a digital decoder 310 is coupled to the output of the quantizer 304. The decoder 310 may include a down sampler, for example a low pass filter, a decimator or an interpolator that uses nonuniform sampling. The decoder 310 may include one or more digital filters including a digital decimator filter provided to decode the time-encoded signal and to decimate the digital signal p[m] having a sampling frequency fs to obtain a digital Y[n] representing the input signal x(t) with a sampling frequency lower than the oversampling frequency fs. The decimator filter may use a sinc filter with a zero at the limit cycle frequency thereby eliminating components of this frequency.

The noise shaping filter 302, the quantizer 304 and the feedback path 306 form a self-oscillating encoder. In the embodiment according to FIG. 24, the noise shaping filter 302 serves as a loop filter for the self-oscillation as well as to provide a noise shaping for the error $q_r[n]$ introduced by sampling the signal in the oscillator. In other words, the loop filter of the self-oscillating encoder and the noise shaping filter to spread the error introduced by sampling with the over sampling frequency fs are implemented in a same analog filter. The filter 302 may be provided in the feedback path or in the feedforward path of the converter 300. The filter 302 in the embodiment according to FIG. 24 may be a high-order filter which still allows self-oscillation as the spectrum of the quantization error signal is of a quasi-periodic nature.

The converter implemented by the encoder/decoder system provides an output sequence, indicated in FIG. 24 as y[n], at the output of the decoder that represents a quantized version of x(t) where the quantization noise is spectrally shaped and that is oversampled by ROSR, imposed by a sampling frequency fs=1/Tc. The signal oversampled with sampling frequency fs is then decimated in the decoder 204 to provide output signal Y[n] with a sampling frequency lower than fs. According to an exemplary embodiment, the OSR may for example be between 8 and 64 and ROSR may be between 4 and 8.

As described with respect to FIG. 3, the signal w(t) in the feed-forward loop of the encoder before quantization and sampling will be a nearly or quasi periodic oscillation due to the feedback loop. Its average period will be Tc=Tr*ROSR/2, hence its spectrum will be concentrated around half the frequency fs. The sampling in the forward path of the encoder causes the quantizer to switch with small time differences in the detection of the actual threshold crossings of w(t). The time uncertainties may be considered as a random variable distributed uniformly between −Tr/2 and Tr/2, representing the additive error qr[n] added to w[n] (or an additive error qr(t) added to the signal w(t)), similar to the quantization error of a quantizer. As this error is fed back by signal u(t) to the noise shaping filter 200, it is shaped in accordance with the characteristic $H_d(s)$. Thus, the implementation of the second feedback loop 318 provides, similar to the second feedback loop in the embodiments according to FIGS. 17 and 18, a noise shaping of the error $q_r[n]$ which is introduced by the sampling in the encoder since the sampled signal sequence T[n] does not match the sampled signal sequence T[n] which was generated by the non-time-quantized corresponding exemplary embodiment shown in FIG. 3. As outlined above, distinguished from the embodiments of FIGS. 17 and 18, errors introduced by the decoder are not noise shaped by the second feedback loop 172. For typical operation frequencies, this small additional error can however be neglected.

Figure 25:
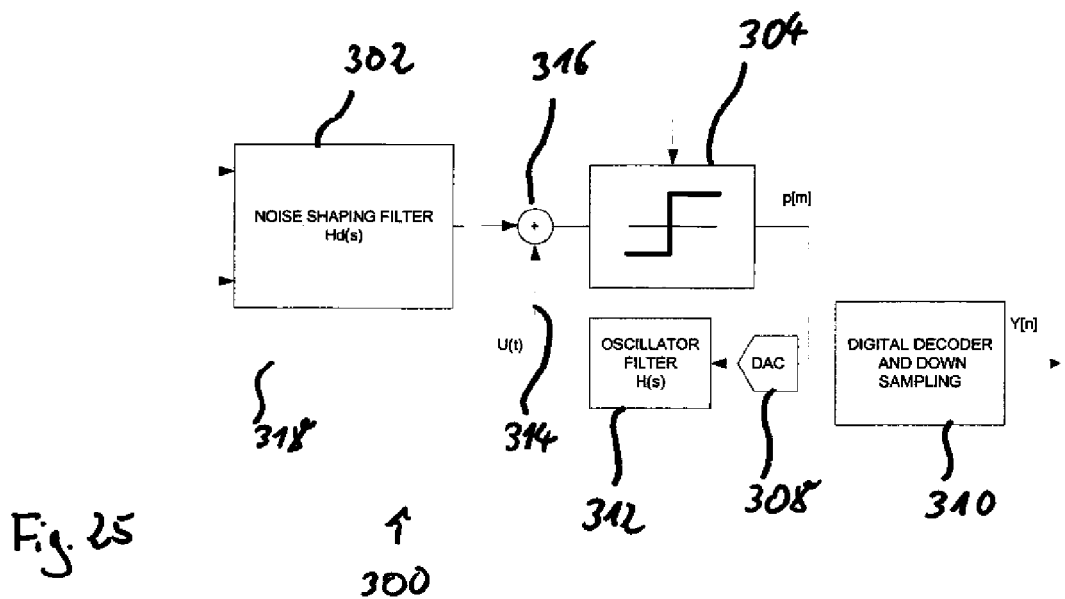
FIG. 25 shows a block diagram of a converter according to an embodiment of the present invention.

Referring now to FIG. 25, a further embodiment of a converter with two feedback paths and two separated filters will be described. The converter 300 according to FIG. 25 comprises in addition to the noise shaping filter 302 a loop filter 312 for the time-encoding oscillator. Similar to the embodiments according to FIG. 24, the single-bit D/A converter is provided for feeding back an analog signal to the loop filter 312 of the oscillator. The loop filter 312 is coupled by a first feedback path 314 to a first summing node 316. The loop filter 312 is further coupled by a second feedback path 318 to the noise shaping filter 302 which may be arranged in the feedback path 318 or in the feedforward path of converter 300. Thus, in this embodiment, two feedback paths are provided. It is to be noted that the arrangement of the filters 302 and 312 in FIG. 25 corresponds to the arrangement of the loop filters 120 and 110 provided in the embodiments according to FIG. 9 and FIG. 17.

By separating the filters 302 and 312, the input to the noise shaping filter 312 is not a raw single bit signal but a analog signal decoded by the analog loop filter 312. The dynamic range of the modulator is enhanced by the gain of the loop filter 312. Furthermore, in correspondence to the embodiment according to FIG. 24, the D/A converter 308 may be implemented as a single-bit D/A converter.

Figure 26:
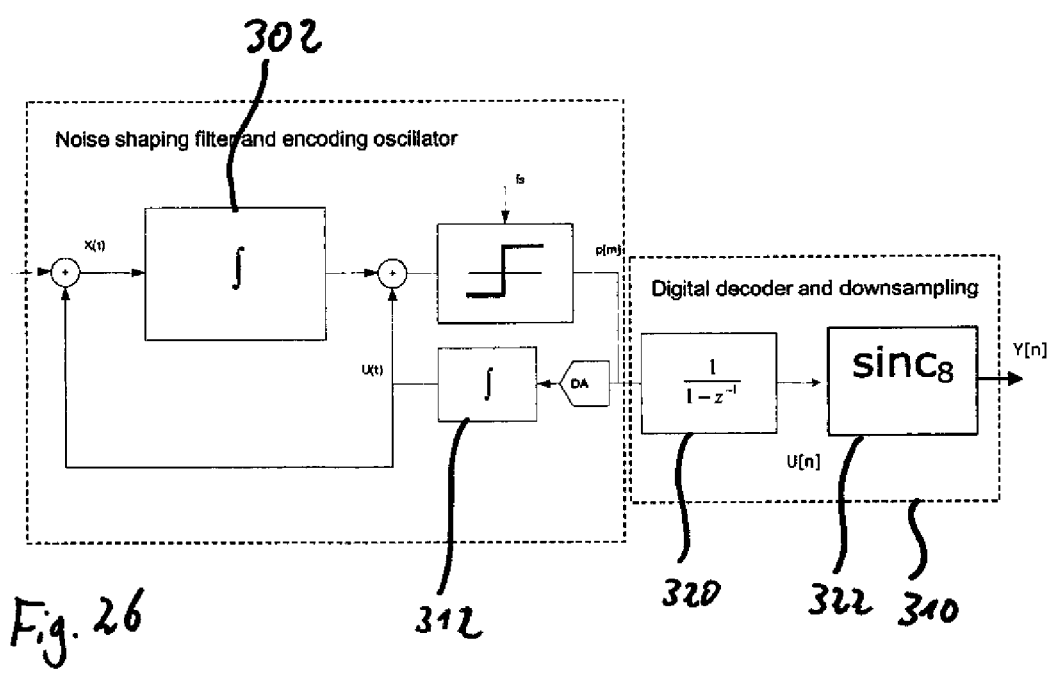
FIG. 26 shows a block diagram of a converter according to an embodiment of the present invention.

As described above, the digital decoder may comprise a decimator using a sinc filter with a zero at the limit cycle frequency thereby eliminating these frequency components. FIG. 26 shows such an implementation where the decoder 310 comprises of a first order digital filter 320 having a filter function corresponding to $1/(1−z^{−1})$ and a second FIR digital sync filter having a filter function sin(z)/z as shown in FIG. 26. Furthermore, in this embodiment, the filters 302 and 312 are first order filters implemented as integrators. It is further to be noted that the implementation shown in FIG. 26 may also be provided in other embodiments.

Figure 27:
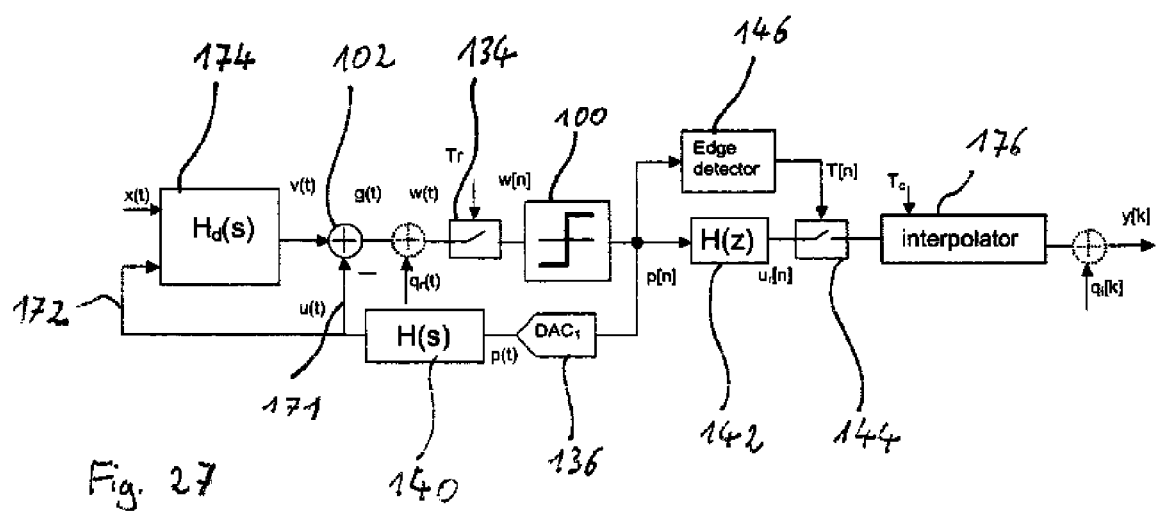
FIG. 27 shows a block diagram of a converter according to an embodiment of the present invention.

Referring now to FIG. 27, a further embodiment will be described which is a modification of the embodiment according to FIG. 17 to implement two feedback paths for feeding back the output signal of the encoder block will be described.

Referring now to FIG. 27, the embodiment according to FIG. 17 is modified to implement a first feedback loop 171 and second feedback loop 172. The output of the loop filter 140 is connected to the first node 102 and to an input of a second loop filter 174, the second loop filter receiving also the input signal x(t) to combine same with the signal provided by the loop filter 140 and filter the signals with the noise shaping filter function $H_d(s)$.

Distinguished from the first and second feedback loops provided in the embodiments according to FIG. 17 wherein a digital signal of the decoder is feed back to an input of the encoder by using a DA converter, the feedback loop 172 of the embodiment according to FIG. 27 feeds back an analog signal of the encoder to the input of the encoder as described with respect to FIGS. 24 to 26.

Furthermore, distinguished from the embodiments according to FIG. 17, the asynchronous-to-synchronous converter in the decoder is implemented as a digital interpolator 176 to generate y[k] from the irregular samples of $u_r[n]$. It is to be noted that the digital interpolator may be replaced by any other asynchronous-to-synchronous converter as outlined above.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A decoder comprising:
    an input to receive a time-encoded signal;
    a filter which is coupled to the input;
    a sampler which has a signal input which is coupled to an output of the filter;
    an edge detector, comprising an input coupled to the input of the decoder, and comprising an output coupled to a clock signal input of the sampler; and
    an asynchronous to synchronous converter, comprising a signal input coupled to the output of the sampler, and an output coupled to an output of the decoder.

2. The decoder according to claim 1, further comprising an interpolator coupled to the sampler.

3. A converter comprising:
    an input;
    an output; and
    a encoding/decoding system, the encoding/decoding system comprising:
    an encoder to generate a time encoded input signal;
    a decoder comprising an input coupled to an output of the encoder, the decoder comprising:
        an edge detector, comprising an input coupled to the input of the decoder;
        a first sampler, comprising a signal input coupled to the input of the decoder and a clock signal input coupled to an output of the edge detector; and
        an asynchronous to synchronous converter, comprising an input coupled to the output of the first sampler, and an output coupled to an output of the encoding/decoding system.

4. The converter according to claim 3, wherein an out-put of the encoding/decoding system is also coupled via a backward path to the input of the encoding/decoding system.

5. The converter according to claim 3, wherein the encoder comprises a first and second loop filter.

6. The converter according to claim 3, wherein the converter comprises a first and second feedback loop.

7. The converter according to claim 3, wherein the encoder comprises a second sampler.

8. The converter according to claim 3, wherein the first and second sampler are implemented to operate at a first oversampling rate.

9. The converter according to claim 3, wherein the asynchronous to synchronous converter is further implemented to decimate the oversampling rate of the output signal of the converter from the first oversampling rate to a second oversampling rate.

10. The converter according to claim 3, wherein the encoder comprises a loop filter, and the decoder comprising a filter simulating a filter function of the loop filter.

11. A converter comprising:
    an input to receive an analog signal;
    an output to provide a digital signal;
    a first encoding circuit coupled to the input, the first circuit comprising a self-oscillating pulse width modulator to provide an oversampled single-bit signal with an oversampling frequency;
    a second decoding circuit coupled to the first circuit to receive the oversampled single-bit signal and configured to provide a digital signal with a sampling frequency lower than the oversampling frequency to the output;
    a feedback path coupled to the first circuit to feed back to the noise shaping filter an analog signal based on the over-sampled single-bit signal.

12. The converter according to claim 11, wherein the noise shaping filter is a higher-order noise shaping filter.

13. The converter according to claim 11, wherein the noise shaping filter is coupled via a digital-to-analog converter to the first circuit.

14. The converter according to claim 11, wherein the second circuit comprises a filter having a filter function with a zero at the limit cycle frequency of the self-oscillating pulse width modulator.

15. The converter according to claim 11, wherein the noise shaping filter is implemented to shape a quasi-periodic signal concentrated at a predetermined frequency.

16. The converter according to claim 11, wherein the feedback path is a feedback path of the self-oscillating pulse width modulator and the noise shaping filter and a loop filter of the self-oscillating pulse width modulator are implemented in a same loop filter.

17. The converter according to claim 11, wherein the feedback path comprises a single bit digital-to-analog converter coupled to the first circuit to receive the oversampled single-bit signal and coupled to the noise shaping filter to provide an analog signal based on the oversampled single-bit signal.

18. A converter comprising:
    an input to receive an analog signal;
    an output to provide a digital signal;
    a first circuit coupled to the input, the first circuit comprising a self-oscillating pulse width modulator to provide an oversampled single-bit signal with an oversampling frequency, the self-oscillating pulse width modulator comprising a first feedback path and a loop filter;
    a second decoding circuit coupled to the first circuit to receive the oversampled single-bit signal and configured to provide a decoded digital signal with a sampling frequency lower than the oversampling frequency to the output; and
    a noise shaping filter; and
    a second feedback path to feed back an analog signal based on the oversampled single-bit signal to the noise shaping filter.

19. The converter according to claim 18, wherein the noise shaping filter is implemented in a feed forward path of the first circuit between the input and the self-oscillating pulse width modulator.

20. The converter according to claim 18, wherein the second decoding circuit comprises a digital filter with a filter function, the filter function having a zero corresponding to the limit cycle frequency of the self-oscillating pulse width modulator.

21. The converter according to claim 18, wherein the second decoding circuit comprises a digital decimator filter with a filter function corresponding to a filter function of the loop filter.

22. The converter according to claim 18, wherein the noise shaping filter is implemented in a feed forward path of the first circuit.

23. The converter according to claim 18, further comprising a single-bit digital-to-analog converter coupled between an output of the first encoding circuit and the loop filter.

24. The converter according to claim 18, wherein an input of the noise shaping filter is coupled to an output of the loop filter.

* * * * *